United States Patent
Iwasawa et al.

(10) Patent No.: US 10,221,105 B2
(45) Date of Patent: Mar. 5, 2019

(54) PLASMA-RESISTANT MEMBER

(71) Applicant: TOTO LTD., Kitakyushu-Shi, Fukuoka (JP)

(72) Inventors: Junichi Iwasawa, Fukuoka-ken (JP); Toshihiro Aoshima, Fukuoka-ken (JP)

(73) Assignee: Toto Ltd., Fukuoka (JP)

( * ) Notice: Subject to any disclaimer, the term of this patent is extended or adjusted under 35 U.S.C. 154(b) by 542 days.

(21) Appl. No.: 14/651,503

(22) PCT Filed: Dec. 27, 2013

(86) PCT No.: PCT/JP2013/085237
§ 371 (c)(1),
(2) Date: Jun. 11, 2015

(87) PCT Pub. No.: WO2014/104354
PCT Pub. Date: Jul. 3, 2014

(65) Prior Publication Data
US 2016/0332921 A1    Nov. 17, 2016

(30) Foreign Application Priority Data

Dec. 28, 2012 (JP) .................. 2012-287511
Sep. 30, 2013 (JP) .................. 2013-205278

(51) Int. Cl.
*C04B 35/505* (2006.01)
*C23C 4/12* (2016.01)
(Continued)

(52) U.S. Cl.
CPC ............ *C04B 41/87* (2013.01); *C04B 35/505* (2013.01); *C04B 35/62222* (2013.01); *C04B 41/009* (2013.01); *C04B 41/5045* (2013.01); *C23C 4/12* (2013.01); *C23C 16/4404* (2013.01); *C23C 24/04* (2013.01); *H01L 21/6833* (2013.01);
(Continued)

(58) Field of Classification Search
CPC ... C04B 41/87; C04B 41/5045; C04B 35/505; C04B 35/6222; H01L 21/6833; C23C 16/4404
See application file for complete search history.

(56) References Cited

U.S. PATENT DOCUMENTS 6,805,952 B2    10/2004   Chang et al.
2003/0019843 A1    1/2003   Kawai et al.
(Continued)

FOREIGN PATENT DOCUMENTS

JP    2001-240482 A    9/2001
JP    3251215 B2    1/2002
(Continued)

*Primary Examiner* — Laura A Auer
(74) *Attorney, Agent, or Firm* — Carrier Blackman & Associates, P.C.; Joseph P. Carrier; William D. Blackman

(57) ABSTRACT

According to an aspect of the invention, there is provided a plasma-resistant member including: a base member; and a layer structural component formed at a surface of the base member, the layer structural component including an yttria polycrystalline body and being plasma resistant, the layer structural component including a first uneven structure, and a second uneven structure formed to be superimposed onto the first uneven structure, the second uneven structure having an unevenness finer than an unevenness of the first uneven structure.

4 Claims, 27 Drawing Sheets

(51) Int. Cl.
  *H01L 21/683* (2006.01)
  *H01L 21/687* (2006.01)
  *C04B 41/87* (2006.01)
  *C23C 16/44* (2006.01)
  *C04B 41/50* (2006.01)
  *C04B 41/00* (2006.01)
  *C04B 35/622* (2006.01)
  *C23C 24/04* (2006.01)

(52) U.S. Cl.
  CPC ............ *H01L 21/68757* (2013.01); *C04B 2235/3217* (2013.01); *C04B 2235/3225* (2013.01); *C04B 2235/781* (2013.01); *C04B 2235/785* (2013.01); *C04B 2235/963* (2013.01); *C04B 2237/066* (2013.01); *C04B 2237/343* (2013.01); *C04B 2237/592* (2013.01)

(56) References Cited

U.S. PATENT DOCUMENTS

| | | |
|---|---|---|
| 2006/0159946 A1 | 7/2006 | Iwasawa et al. |
| 2006/0178010 A1 | 8/2006 | Iwasawa et al. |
| 2008/0276865 A1 | 11/2008 | Nishimizu et al. |
| 2009/0162647 A1* | 6/2009 | Sun .............. C23C 16/4404 428/336 |
| 2012/0216955 A1 | 8/2012 | Eto et al. |

FOREIGN PATENT DOCUMENTS

| | | |
|---|---|---|
| JP | 2005-217350 A | 8/2005 |
| JP | 3864958 B2 | 1/2007 |
| JP | 2008-160093 A | 7/2008 |
| JP | 2011-162855 A | 8/2011 |
| JP | 2012-054590 A | 3/2012 |
| JP | 2012-191200 A | 10/2012 |

* cited by examiner

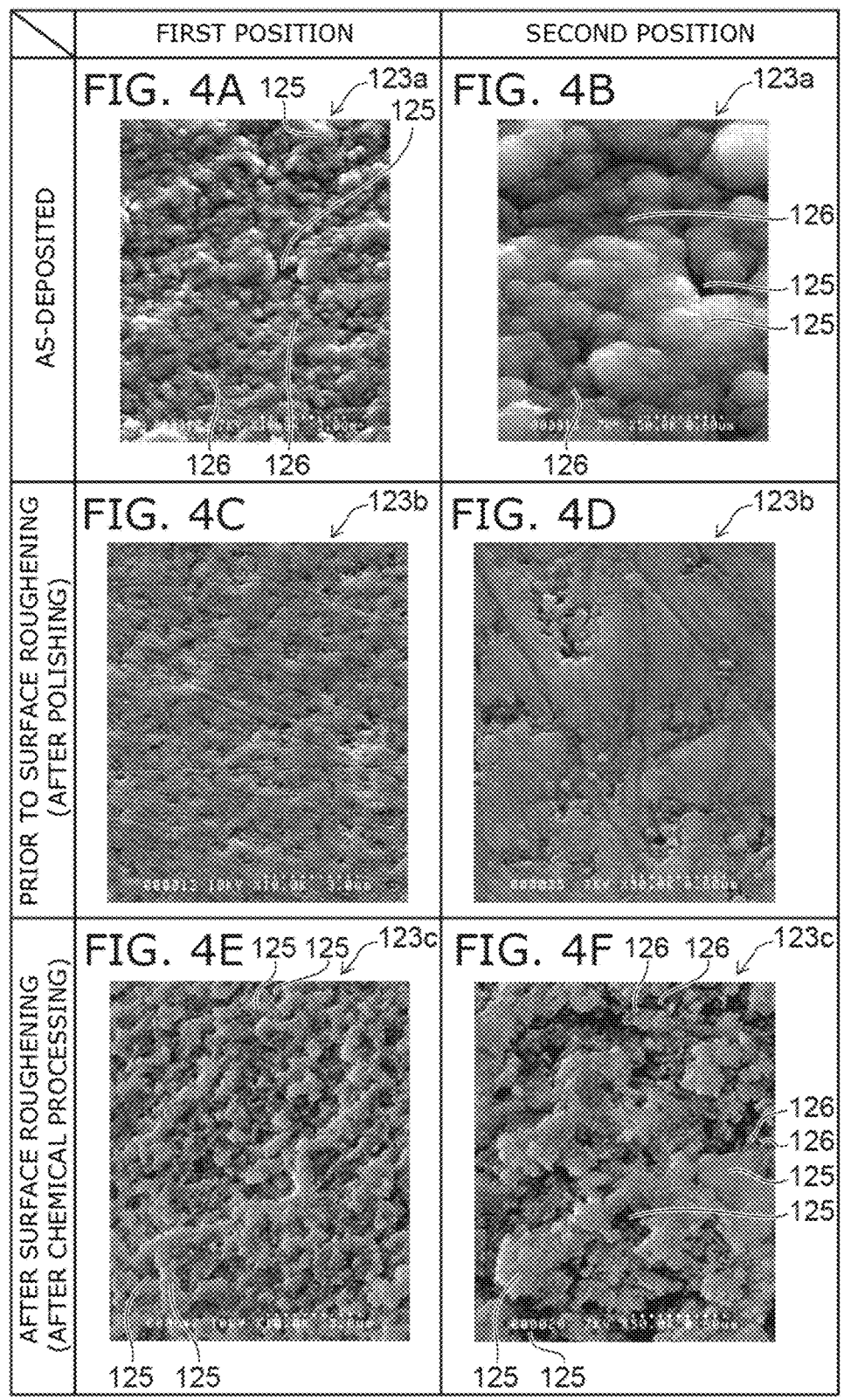

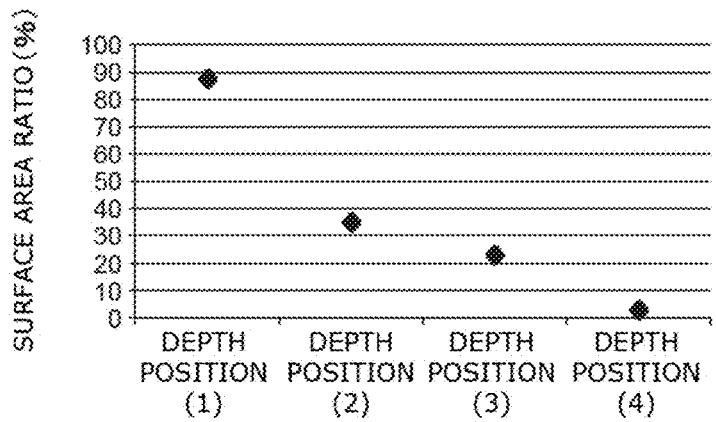
FIG. 16A
| FIGURE NUMBER | FIG. 15B | FIG. 15C | FIG. 15D | FIG. 15E |
|---|---|---|---|---|
| DEPTH POSITION | DEPTH POSITION(1) | DEPTH POSITION(2) | DEPTH POSITION(3) | DEPTH POSITION(4) |
| AREA MEASUREMENT SURFACE AREA ($nm^2$) | 70402.65 | 70402.65 | 70402.65 | 70402.65 |
| TOTAL SURFACE AREA ($nm^2$) | 61540.98 | 24530.66 | 15978.44 | 1802.06 |
| SURFACE AREA RATIO (%) | 87.41 | 34.84 | 22.70 | 2.56 |
FIG. 16B
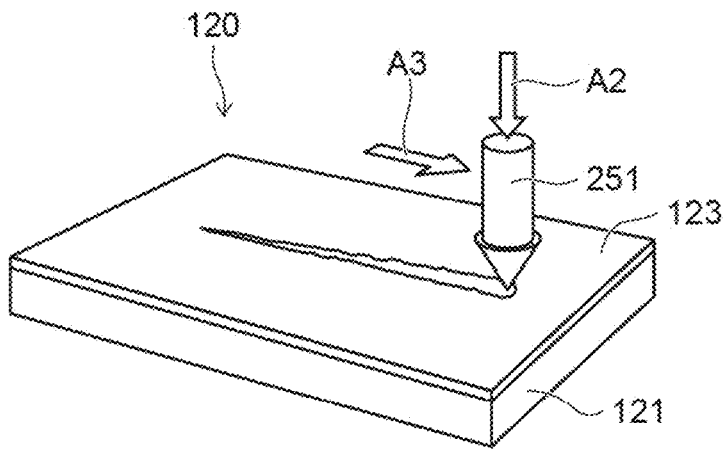
FIG. 17

| SAMPLE | PEELING AREA RATIO OF SiO$_2$ FILM (%) | ADHESION STRENGTH OF SiO$_2$ FILM | Sa (µm) | Vmc (µm³/µm²) | Vvc (µm³/µm²) | Sdr |
|---|---|---|---|---|---|---|
| THERMAL SPRAYING | UNMEASURABLE | × | 0.165 | 0.156 | 0.226 | 192 |
| CHEMICAL PROCESSING(1) | 2-3 | ○ | 0.075 | 0.079 | 0.100 | 28 |
| CHEMICAL PROCESSING(2) | 5-6 | ○ | 0.048 | 0.053 | 0.065 | 11 |
| MIRROR SURFACE | 24 | × | 0.007 | 0.008 | 0.010 | 0.4 |
| AS-DEPOSITED | 14-18 | △ | 0.026 | 0.030 | 0.036 | 3.4 |
| PHYSICAL PROCESSING(2) | 11-13 | △ | 0.030 | 0.031 | 0.038 | 3.7 |

| SAMPLE | PEELING AREA RATIO OF SiO$_2$ FILM (%) | ADHESION STRENGTH OF SiO$_2$ FILM | Sa (μm) | Vmc (μm$^3$/μm$^2$) | Vvc (μm$^3$/μm$^2$) | Sdr | S△q |
|---|---|---|---|---|---|---|---|
| THERMAL SPRAYING | UNMEASURABLE | × | 0.05 | 0.049 | 0.067 | 47 | 1.1 |
| CHEMICAL PROCESSING(1) | 2-3 | ○ | 0.033 | 0.034 | 0.045 | 15 | 0.57 |
| CHEMICAL PROCESSING(2) | 5-6 | ○ | 0.020 | 0.020 | 0.022 | 6 | 0.35 |
| MIRROR SURFACE | 24 | × | 0.004 | 0.004 | 0.005 | 0.2 | 0.04 |
| AS-DEPOSITED | 14-18 | △ | 0.010 | 0.010 | 0.012 | 1.1 | 0.15 |
| PHYSICAL PROCESSING(2) | 11-13 | △ | 0.010 | 0.011 | 0.014 | 1.5 | 0.17 |

| LAYER STRUCTURAL COMPONENT | AD FILM | SINTERED BODY | THERMAL-SPRAYED FILM |
|---|---|---|---|
| CRYSTALLITE SIZE (nm) | 19 | 218 | 71 |

PLASMA-RESISTANT MEMBER

TECHNICAL FIELD

An aspect of the invention generally relates to a plasma-resistant member, and specifically relates to a plasma-resistant member used in a semiconductor manufacturing apparatus that performs processing such as dry etching, sputtering, CVD, etc., inside a chamber.

BACKGROUND ART

In the manufacturing processes of a semiconductor, it is necessary to reduce particles of a patterning object and increase the yield by reducing discrepancies of the manufactured device.

Conversely, there is a manufacturing apparatus of an electronic device in which the ceiling of the chamber includes quartz glass and the average surface roughness of a micro uneven portion formed in the inner surface of the ceiling is 0.2 to 5 μm (Patent Document 1). There is a plasma-resistant member in which pores (holes) or a grain boundary layer do not exist and the occurrence of particle detachment from the plasma-resistant member is suppressed/reduced (Patent Document 2). There is a part of a plasma reactor including a covering film of a ceramic, a polymer material, etc., that is plasma thermal-sprayed on the surfaces of the part of the plasma reactor exposed to the plasma and has surface roughness characteristics that promote the adhesion of polymer deposits (Patent Document 3). According to the part of the plasma reactor described in Patent Document 3, the particle contamination in the processing can be reduced. There is a plasma-resistant member in which a corrosion-resistant surface layer made of at least one type of a fluoride, oxide, or nitride of a metal is formed on the surface of a base body made of a silicon nitride sintered body with an interposed intermediate layer made of $SiO_2$ or a hybrid oxide of silicon and an element of Group 3a of the periodic table (Patent Document 4). According to the plasma-resistant member described in Patent Document 4, because the silicon nitride sintered body has a lower loss and high strength, the corrosion resistance is improved further; and the reliability with regard to damage increases.

In the manufacturing processes of the semiconductor, there are cases where the interior wall of the chamber is covered substantially uniformly with a pre-coated film (a covering film) to reduce the particles. The pre-coated film is formed of a material that does not have a negative effect on the semiconductor device. In the case where the interior wall of the chamber is covered substantially uniformly with the covering film, it is necessary to increase the adhesion strength or adhesion force of the covering film so that the covering film does not peel easily. Also, it is necessary for the covering film that covers the interior of the chamber to cause the reaction products, the particles, etc., to adhere to the surface of the covering film itself and be trapped even when the reaction products, the particles, etc., are produced inside the chamber. Recently, finer patterns of semiconductor devices are progressing; and the control of nanolevel particles is necessary.

CITATION LIST

Patent Literature

[Patent Citation 1] JP 3251215
[Patent Citation 2] JP 3864958
[Patent Citation 3] JP 2012-54590 A (Kokai)
[Patent Citation 4] JP 2001-240482 A (Kokai)

SUMMARY OF INVENTION

Problem to be Solved by the Invention

A plasma-resistant member that can increase the adhesion strength or adhesion force of the covering film that covers the interior wall of the chamber or that can reduce the particles is to be provided.

Means for Solving the Problem

According to an aspect of the invention, there is provided a plasma-resistant member including: a base member; and a layer structural component formed at a surface of the base member, the layer structural component including an yttria polycrystalline body and being plasma resistant, the layer structural component including a first uneven structure, and a second uneven structure formed to be superimposed onto the first uneven structure, the second uneven structure having an unevenness finer than an unevenness of the first uneven structure.

According to another aspect of the invention, there is provided a plasma-resistant member including a base member; and a layer structural component formed at a surface of the base member, the layer structural component including an yttria polycrystalline body and being plasma resistant, in the case where a cut-off of surface analysis is 0.8 μm: the arithmetic average Sa of a surface of the layer structural component being not less than 0.010 μm and not more than 0.035 μm; the core material volume Vmc determined from a load curve of the surface of the layer structural component being not less than 0.01 $\mu m^3/\mu m^2$ and not more than 0.035 $\mu m^3/\mu m^2$; the core void volume Vvc determined from the load curve of the surface of the layer structural component is not less than 0.012 $\mu m^3/\mu m^2$ and not more than 0.05 $\mu m^3/\mu m^2$; the developed interfacial area ratio Sdr of the surface of the layer structural component is not less than 1 and not more than 17; and the root mean square slope SΔq of the surface of the layer structural component is not less than 0.15 and not more than 0.6.

BRIEF DESCRIPTION OF DRAWINGS

FIG. 4A to FIG. 4F are photographs of enlarged surfaces of the layer structural component formed at the surface of the plasma-resistant member.

FIG. 16A and FIG. 16B are a graph and a table showing an example of the surface area ratio with respect to the depth position.

FIG. 17 is a schematic perspective view describing the method for measuring the adhesion strength of the pre-coated film.

DESCRIPTION OF EMBODIMENT

Figure 1:
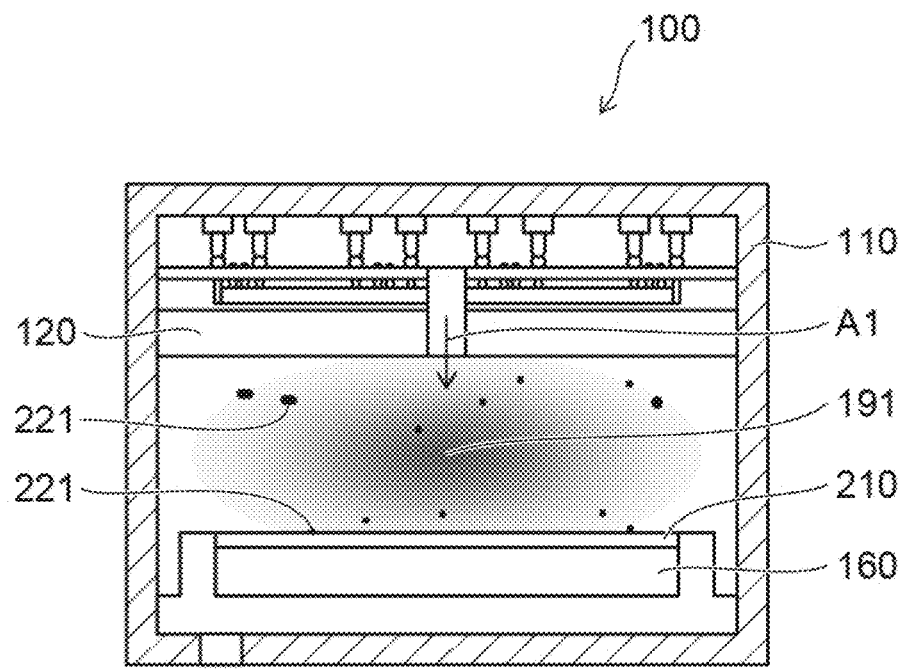
FIG. 1 is a schematic cross-sectional view showing a semiconductor manufacturing apparatus including a plasma-resistant member according to an embodiment of the invention.

A first invention is a plasma-resistant member including a base member, and a layer structural component formed at a surface of the base member, the layer structural component including an yttria polycrystalline body and being plasma-resistant, the layer structural component having a first uneven structure and a second uneven structure, the second uneven structure being formed to be superimposed onto the first uneven structure and having an unevenness finer than an unevenness of the first uneven structure.

According to this plasma-resistant member, the interior wall of a chamber can be covered substantially uniformly with a pre-coated film (a covering film) that does not have a negative effect on the semiconductor device to reduce the particles produced in the manufacturing processes of a semiconductor. The adhesion strength or adhesion force of the covering film can be increased. The layer structural component has a structure (a structure similar to a fractal structure) in which the second uneven structure is formed to be superimposed onto the first uneven structure. Therefore, an anchor effect due to the fine uneven structure is obtained; and a stable adhesion strength or adhesion force for the base member can be obtained. The covering film that is formed on the layer structural component for which the anchor effect is obtained can cause the reaction products, the particles, etc., to adhere to the surface of the covering film itself and be trapped with higher certainty. Thereby, the particles that are produced in the manufacturing processes of the semiconductor can be reduced.

A second invention is the plasma-resistant member of the first invention, wherein the first uneven structure has voids made in a portion of a surface of the layer structural component, the voids are where groups of crystal particles detached, the second uneven structure has an unevenness formed in the entire surface of the layer structural component, and a size of the crystal particles of the unevenness is fine.

According to this plasma-resistant member, an anchor effect due to the fine uneven structure is obtained over substantially the entire surface of the layer structural component; and a more a stable adhesion strength or adhesion force for the base member can be obtained. A covering film that is formed on the layer structural component for which the anchor effect is obtained can cause the reaction products, the particles, etc., to adhere to the surface of the covering film itself and be trapped with higher certainty. Thereby, the particles that are produced in the manufacturing processes of the semiconductor can be reduced.

A third invention is the plasma-resistant member of the first invention, wherein the arithmetic average Sa of a surface of the layer structural component is not less than 0.025 μm and not more than 0.075 μm, the core material volume Vmc determined from a load curve of the surface of the layer structural component is not less than 0.03 μm$^3$/μm$^2$ and not more than 0.08 μm$^3$/μm$^2$, the core void volume Vvc determined from the load curve of the surface of the layer structural component is not less than 0.03 m$^3$/μm$^2$ and not more than 0.1 m$^3$/μm$^2$, and the developed interfacial area ratio Sdr of the surface of the layer structural component is not less than 3 and not more than 28.

According to this plasma-resistant member, the three-dimensional surface texture of the surface of the layer structural component becomes more distinct. Thereby, the adhesion strength or adhesion force of the covering film can be increased further. The covering film can cause the reaction products, the particles, etc., to adhere to the surface of the covering film itself and be trapped with higher certainty. Thereby, the particles that are produced in the manufacturing processes of the semiconductor can be reduced further.

A fourth invention is the plasma-resistant member of the first invention, wherein the first uneven structure and the second uneven structure are formed by performing chemical processing.

According to this plasma-resistant member, the adhesion strength or adhesion force of the covering film is increased; and the first uneven structure and the second uneven structure that are more favorable for reducing the particles can be obtained.

A fifth invention is the plasma-resistant member of the first invention, wherein the layer structural component has a sparse and dense structure of the yttria polycrystalline body.

In the case where the interior wall of the chamber is covered with a covering film, it is necessary to increase the adhesion strength or adhesion force of the covering film so that the covering film does not peel easily.

Conversely, according to the plasma-resistant member of the invention, the first uneven structure and the second uneven structure are formed easily because the layer structural component has the sparse and dense structure of the yttria polycrystalline body. In other words, the first uneven structure is formed easily in the portions where the density is sparse. Therefore, it is considered that the second uneven structure is easily formed to be superimposed onto the first uneven structure. Thereby, the adhesion strength or adhesion force of the covering film can be increased.

A sixth invention is the plasma-resistant member of the fifth invention, wherein the sparse portions of the sparse and dense structure become smaller from a layer at a surface of the layer structural component toward a layer deeper than the layer at the surface.

In the case where the interior wall of a chamber is covered with a covering film, it is necessary to increase the adhesion strength or adhesion force of the covering film so that the covering film does not peel easily.

Conversely, according to the plasma-resistant member of the invention, the sparse portions of the sparse and dense structure become smaller from the layer at the surface of the layer structural component toward the layer deeper than the layer of the surface. Therefore, the recess of the fine uneven structure is formed easily at the layer deeper than the layer at the surface of the layer structural component. Thereby, the anchor effect is obtained; and a stable adhesion strength or adhesion force for the base member can be obtained.

A seventh invention is the plasma-resistant member of the fifth invention, wherein the sparse and dense structure includes sparse portions distributed three-dimensionally inside a dense portion, and a density of the sparse portions is lower than a density of the dense portion.

According to this plasma-resistant member, the sparse and dense structure is distributed three-dimensionally at the surface and in the thickness direction (the depth direction) of the stacked structural component. Therefore, the adhesion strength or adhesion force of the covering film can be increased further.

An eighth invention is the plasma-resistant member of the first invention, wherein the layer structural component is formed by aerosol deposition.

According to this plasma-resistant member, the layer structural component has a dense structure compared to an yttria sintered body, an yttria thermal-sprayed film, etc. Thereby, the plasma resistance of the plasma-resistant member is higher than the plasma resistances of the sintered body, the thermal-sprayed film, etc. The probability of the plasma-resistant member being a production source of particles is lower than the probability of the sintered body, the thermal-sprayed film, etc., being production sources of particles. Thereby, the particles can be reduced while maintaining the plasma resistance of the plasma-resistant member.

A ninth invention is a plasma-resistant member including a base member, and a layer structural component formed at a surface of the base member, the layer structural component including an yttria polycrystalline body and being plasma-resistant; and in the case where a cut-off of surface analysis is 0.8 μm, the arithmetic average Sa of a surface of the layer structural component is not less than 0.010 μm and not more than 0.035 μm, the core material volume Vmc determined from a load curve of the surface of the layer structural component is not less than 0.01 m$^3$/μm$^2$ and not more than 0.035 μm$^3$/μm$^2$, the core void volume Vvc determined from the load curve of the surface of the layer structural component is not less than 0.012 μm$^3$/μm$^2$ and not more than 0.05 μm$^3$/μm$^2$, the developed interfacial area ratio Sdr of the surface of the layer structural component is not less than 1 and not more than 17, and the root mean square slope SΔq of the surface of the layer structural component is not less than 0.15 and not more than 0.6.

According to this plasma-resistant member, the interior wall of a chamber can be covered substantially uniformly with a pre-coated film (a covering film) that does not have a negative effect on the semiconductor device to reduce the particles produced in the manufacturing processes of the semiconductor. Also, the adhesion strength or adhesion force of the covering film can be increased.

A tenth invention is the plasma-resistant member of the ninth invention, wherein the layer structural component has a sparse and dense structure of the yttria polycrystalline body.

In the case where the interior wall of a chamber is covered with a covering film, it is necessary to increase the adhesion strength or adhesion force of the covering film so that the covering film does not peel easily.

Conversely, according to the plasma-resistant member of the invention, the first uneven structure and the second uneven structure are formed easily because the layer structural component has the sparse and dense structure of the yttria polycrystalline body. In other words, the first uneven structure is formed easily at the portions where the density is sparse. Therefore, it is considered that the second uneven structure is easily formed to be superimposed onto the first uneven structure. Thereby, the adhesion strength or adhesion force of the covering film can be increased.

An eleventh invention is the plasma-resistant member of the tenth invention, wherein sparse portions of the sparse and dense structure become smaller from a layer at the surface of the layer structural component toward a layer deeper than the layer at the surface.

In the case where the interior wall of a chamber is covered with a covering film, it is necessary to increase the adhesion strength or adhesion force of the covering film so that the covering film does not peel easily.

Conversely, according to the plasma-resistant member of the invention, the sparse portions of the sparse and dense structure become smaller from the layer at the surface of the layer structural component toward the layer deeper than the layer of the surface. Therefore, the recess of the fine uneven structure is formed easily at the layer deeper than the layer at the surface of the layer structural component. Thereby, the anchor effect is obtained; and a stable adhesion strength or adhesion force for the base member can be obtained.

A twelfth invention is the plasma-resistant member of the tenth invention, wherein the sparse and dense structure includes sparse portions distributed three-dimensionally inside a dense portion, and a density of the sparse portions is lower than a density of the dense portion.

According to this plasma-resistant member, the sparse and dense structure is distributed three-dimensionally at the surface and in the thickness direction (the depth direction) of the stacked structural component. Therefore, the adhesion strength or adhesion force of the covering film can be increased further.

A thirteenth invention is the plasma-resistant member of the ninth invention, wherein the layer structural component is formed by aerosol deposition.

According to this plasma-resistant member, the layer structural component has a dense structure compared to an yttria sintered body, an yttria thermal-sprayed film, etc. Thereby, the plasma resistance of the plasma-resistant member is higher than the plasma resistances of the sintered body, the thermal-sprayed film, etc. The probability of the plasma-resistant member being a production source of particles is lower than the probability of the sintered body, the thermal-sprayed film, etc., being production sources of particles. Thereby, the particles can be reduced while maintaining the plasma resistance of the plasma-resistant member.

Embodiments of the invention will now be described with reference to the drawings. Similar components in the drawings are marked with like reference numerals, and a detailed description is omitted as appropriate.

FIG. 1 is a schematic cross-sectional view showing a semiconductor manufacturing apparatus including a plasma-resistant member according to an embodiment of the invention.

Figure 2:
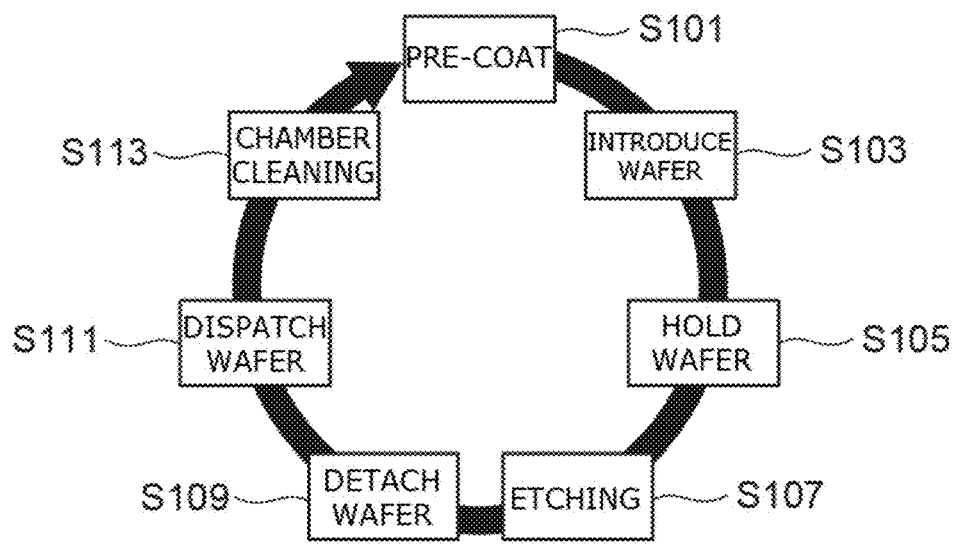
FIG. 2 is a schematic view showing an example of the manufacturing processes of the semiconductor.

FIG. 2 is a schematic view showing an example of the manufacturing processes of the semiconductor.

The semiconductor manufacturing apparatus 100 shown in FIG. 1 includes a chamber 110, a plasma-resistant member 120, and an electrostatic chuck 160. The plasma-resistant member 120 is called, for example, the top plate, etc., and is provided at the upper portion in the interior of the chamber 110. The electrostatic chuck 160 is provided at the lower portion in the interior of the chamber 110. That is, the plasma-resistant member 120 is provided on the electrostatic chuck 160 in the interior of the chamber 110. An object to be held such as a wafer 210 or the like is placed on the electrostatic chuck 160.

Figure 5A:
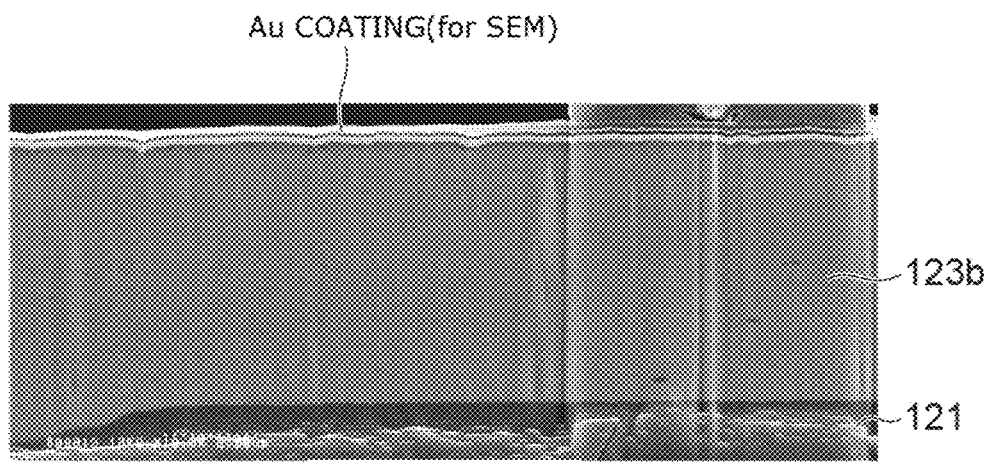
FIG. 5A and FIG. 5B are photographs showing cross sections of the layer structural component formed at the surface of the plasma-resistant member.
Figure 5B:
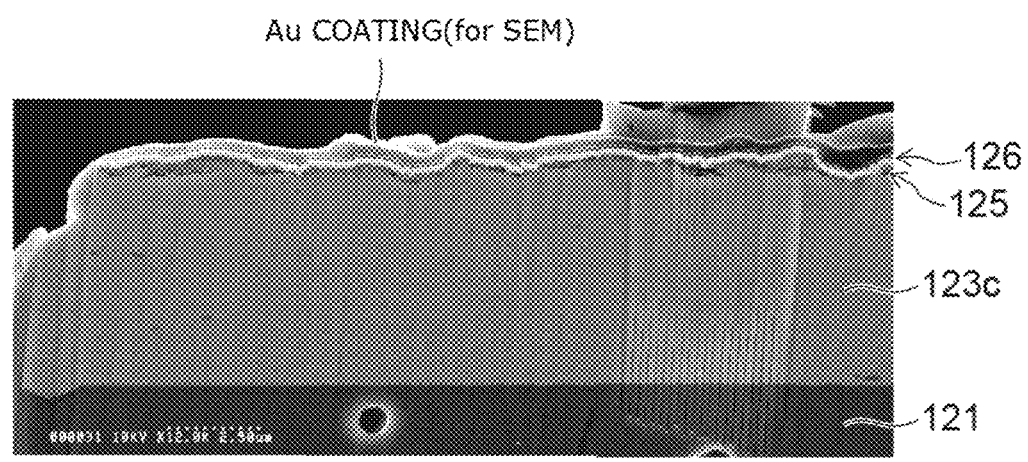

For example, the plasma-resistant member 120 has a structure in which a layer structural component 123 that includes an yttria ($Y_2O_3$) polycrystalline body (referring to FIG. 5A and FIG. 5B) is formed on the surface of a base member 121 that includes alumina ($Al_2O_3$) (referring to FIG. 5A and FIG. 5B). The layer structural component 123 of the yttria polycrystalline body is formed by aerosol deposition. The material of the base member 121 is not limited to a ceramic such as alumina, etc., and may be quartz, alumite, a metal, glass, etc.

Aerosol deposition is a method for squirting an aerosol including fine particles including a brittle material dispersed in a gas from a nozzle toward the base member 121 such as a metal, glass, ceramic, plastic, etc., causing the fine particles to collide with the base member 121, and causing the brittle material fine particles to deform, fragment, and bond due to the impact of the collisions to directly form the layer structural component (also called the film structural component) 123 made of the constituent material of the fine particles on the base member 121. According to this method, a heating unit, a cooling unit, or the like is not particularly necessary; it is possible to form the layer structural component 123 at room temperature; and the layer structural component 123 that has a mechanical strength equal to or greater than that of a sintered body can be obtained. It is possible to diversely change the density, the mechanical strength, the electrical characteristics, etc., of the layer structural component 123 by controlling the configuration and composition of the fine particles, the conditions of causing the fine particles to collide, etc.

In the specification of the application, "polycrystal" refers to a structural body in which crystal particles are bonded/integrated. A crystal substantially includes one crystal particle. However, the crystal particles are a polycrystal in the case where fine particles are assimilated into the structural component without fragmenting. Normally, the diameter of the average crystal particle is not less than 5 nanometers (nm) and not more than 50 nm. It is more favorable for the diameter of the average crystal particle to be 30 nm or less. For example, the diameter of the average crystal particle can be calculated by the Scherrer method using XRD (X-ray Diffraction) analysis, etc.

In the specification of the application, in the case where the primary particle is a dense particle, "fine particle" refers to a particle having an average particle diameter of 5 micrometers (μm) or less when the average particle diameter is identified by a particle size distribution measurement, a scanning electron microscope, etc. In the case where the primary particle is a porous particle easily fragmented by impacting, "fine particle" refers to a particle having an average particle diameter of 50 μm or less.

In the specification of the application, "aerosol" refers to a solid-gas mixed phase substance in which the fine particles described above are dispersed in a gas such as helium, nitrogen, argon, oxygen, dry air, a gas mixture including such elements, etc.; and although there are cases where an agglomerate is included, "aerosol" refers to the state in which the fine particles are dispersed substantially solitarily. Although the gas pressure and temperature of the aerosol are arbitrary, for the formation of the layer structural component 123, it is desirable for the concentration of the fine particles inside the gas when squirted from the dispensing aperture to be within the range of 0.0003 mL/L to 5 mL/L when converted to a gas pressure of 1 atmosphere and a temperature of 20 degrees Celsius.

One feature of the process of aerosol deposition is that the process normally is implemented at room temperature, and it is possible to form the layer structural component 123 at a temperature that is sufficiently lower than the melting point of the fine particle material, that is, several hundred degrees Celsius or less.

In the specification of the application, "room temperature" refers to a temperature that is markedly lower than the sintering temperature of a ceramic and refers to a room temperature environment of substantially 0 to 100° C.

For the fine particles included in the powder body used as the source material of the layer structural component 123, a brittle material such as a ceramic, a semiconductor, etc., may be used as a major body, and fine particles of the same material may be used alone or fine particles having different particle diameters may be mixed; and it is possible to mix and combine different types of brittle material fine particles. It is possible to use fine particles of a metal material, an organic material, etc., by mixing the fine particles of the metal material, the organic material, etc., with the brittle material fine particles and coating the fine particles of the metal material, the organic material, etc., onto the surfaces of the brittle material fine particles. Even in such cases, the brittle material is the major part of the formation of the layer structural component 123.

In the specification of the application, "powder body" refers to the state in which the fine particles described above are naturally coalesced.

For the hybrid structural component formed by such methods, in the case where crystalline brittle material fine particles are used as the source material, the portion of the layer structural component 123 of the hybrid structural component is a polycrystalline body having a small crystal particle size compared to the source material fine particles; and there are many cases where the crystals of the polycrystalline body have substantially no crystal orientation. A grain boundary layer that is made of a glass layer substantially does not exist at the interface between the brittle material crystals. In many cases, the layer structural component 123 portion of the hybrid structural component forms an anchor layer that juts into the surface of the base member 121. The layer structural component 123 in which the anchor layer is formed is adhered securely to the base member 121 with exceedingly high strength.

The layer structural component 123 that is formed by aerosol deposition possesses sufficient strength and is clearly different from a so-called powder compact in which the form of the fine particles packed together is maintained by being physical adhered by pressure.

In aerosol deposition, it can be confirmed that fragmentation/deformation occurs for the brittle material fine particles flying onto the base member 121 by using X-ray analysis, etc., to measure the size of the brittle material fine particles used as the source material and the size of the crystallites (crystal particles) of the brittle material structural component that is formed. In other words, the crystallite size of the layer structural component 123 formed by aerosol deposition is smaller than the crystallite size of the source material fine particles. New major surfaces are formed at the shift surfaces and the fracture surfaces formed by the fine particles fragmenting and deforming; and the new major surfaces are in the state in which atoms that were in the interior of the fine particle and bonded to other atoms are exposed. It is considered that the layer structural component 123 is formed by the new major surfaces which are active and have high surface energy being bonded to the surfaces of adjacent brittle material fine particles, adjacent new major surfaces of the brittle material, or the surface of the base member 121.

In the case where an appropriate amount of hydroxide groups exist at the surfaces of the fine particles inside the aerosol, it also may be considered that the bonding occurs due to mechano-chemical acid-base dehydration reactions occurring due to local shifting stress, etc., between the fine particles or between the structural component and the fine particles when the fine particles collide. It is considered that adding a continuous mechanical impact force from the outside causes these phenomena to occur continuously; the progression and densification of the bonds occur due to the repetition of the deformation, fragmentation, etc., of the fine particles; and the layer structural component 123 that is made of the brittle material grows.

In the semiconductor manufacturing apparatus 100, high frequency power is supplied; and, for example, a source gas of a halogen-based gas, etc., is introduced to the interior of the chamber 110 as illustrated by arrow A1 shown in FIG. 1. Then, the source gas that is introduced to the interior of the chamber 110 is plasmatized in a region 191 between the electrostatic chuck 160 and the plasma-resistant member 120.

The plasma-resistant member 120 is one of the important members for generating high-density plasma. If particles 221 produced in the interior of the chamber 110 adhere to the wafer 210, discrepancies may occur in the semiconductor device that is manufactured. Then, the yield and productivity of the semiconductor device may decrease. Therefore, plasma resistance is necessary for the plasma-resistant member 120.

Therefore, for example, in the manufacturing processes of the semiconductor as shown in FIG. 2, there are cases where the interior wall of the chamber 110 is covered with a pre-coated film (hereinbelow, also called a "covering film" for convenience of description) to reduce the particles 221. In such a case, the pre-coated film is formed of a material that does not have a negative effect on the semiconductor device. In other words, for the manufacturing processes of the semiconductor shown in FIG. 2, first, the interior wall of the chamber 110 is covered with the covering film to reduce the particles 221 (step S101). Continuing, the wafer 210 is introduced to the interior of the chamber 110 (step S103); and the wafer 210 is attracted and held by the electrostatic chuck 160 (step S105).

Continuing, etching is performed (step S107); the wafer 210 is detached from the electrostatic chuck 160 (step S109); and the wafer 210 is dispatched outside the chamber 110 (step S111). Continuing, cleaning of the interior of the chamber 110 is performed by generating plasma in the interior of the chamber 110 (step S113). Then, the operation described above in regard to step S101 is performed again (step S101).

According to knowledge obtained by the inventor, it is considered that the pre-coated film is substantially consumed when the etching described above in regard to step S107 is completed. There are constraints according to the purpose and application for the thickness of the pre-coated film and the source material and gas type that can be used for the pre-coated film. In particular, sections where the pre-coated film is consumed first partway through the etching process are directly exposed to the plasma. Therefore, it is necessary for the members inside the chamber 110 to be plasma-resistant. On the other hand, in the cleaning of the chamber 110 (step S113), the cleaning is performed by generating plasma. Therefore, it is necessary for the members of the interior of the chamber 110 to be plasma-resistant.

Conversely, the plasma-resistant member 120 of the embodiment has a structure in which the layer structural component 123 including the yttria polycrystalline body is formed by aerosol deposition at the surface of the base member 121 including alumina. The layer structural component 123 of the yttria polycrystalline body formed by aerosol deposition has a dense structure compared to an yttria sintered body, an yttria thermal-sprayed film, etc. Thereby, the plasma resistance of the plasma-resistant member 120 of the embodiment is higher than the plasma resistances of the sintered body, the thermal-sprayed film, etc. Also, the probability of the plasma-resistant member 120 of the embodiment being a production source of particles is lower than the probability of the sintered body, the thermal-sprayed film, etc., being production sources of particles.

On the other hand, in the case where the interior wall of the chamber 110 is covered with the covering film as in the manufacturing processes of the semiconductor described above in regard to FIG. 2, it is necessary to increase the adhesion strength or adhesion force of the covering film so that the covering film does not peel easily. Even when the reaction products, the particles, etc., are produced in the interior of the chamber 110, it is necessary for the covering film that covers the interior of the chamber 110 to cause the reaction products, the particles, etc., to adhere to the surface of the covering film itself and be trapped.

Conversely, the plasma-resistant member 120 of the embodiment has a rough surface compared to a surface on which polishing is performed. In other words, there are cases where polishing of the layer structural component 123 that is formed at the surface of the plasma-resistant member 120 is performed to further increase the plasma resistance or to further increase the sealability of the interior of the chamber 110. Conversely, the plasma-resistant member 120 of the embodiment has a rough surface compared to the surface on which the polishing is performed. Specifically, the layer structural component 123 that is formed at the surface of the plasma-resistant member 120 of the embodiment has an uneven structure.

Thereby, the inventor obtained the knowledge that the particles can be reduced while maintaining the plasma resistance of the plasma-resistant member 120.

The uneven structure of the layer structural component 123 formed at the surface of the plasma-resistant member 120 of the embodiment will now be described with reference to the drawings.

Figure 3:
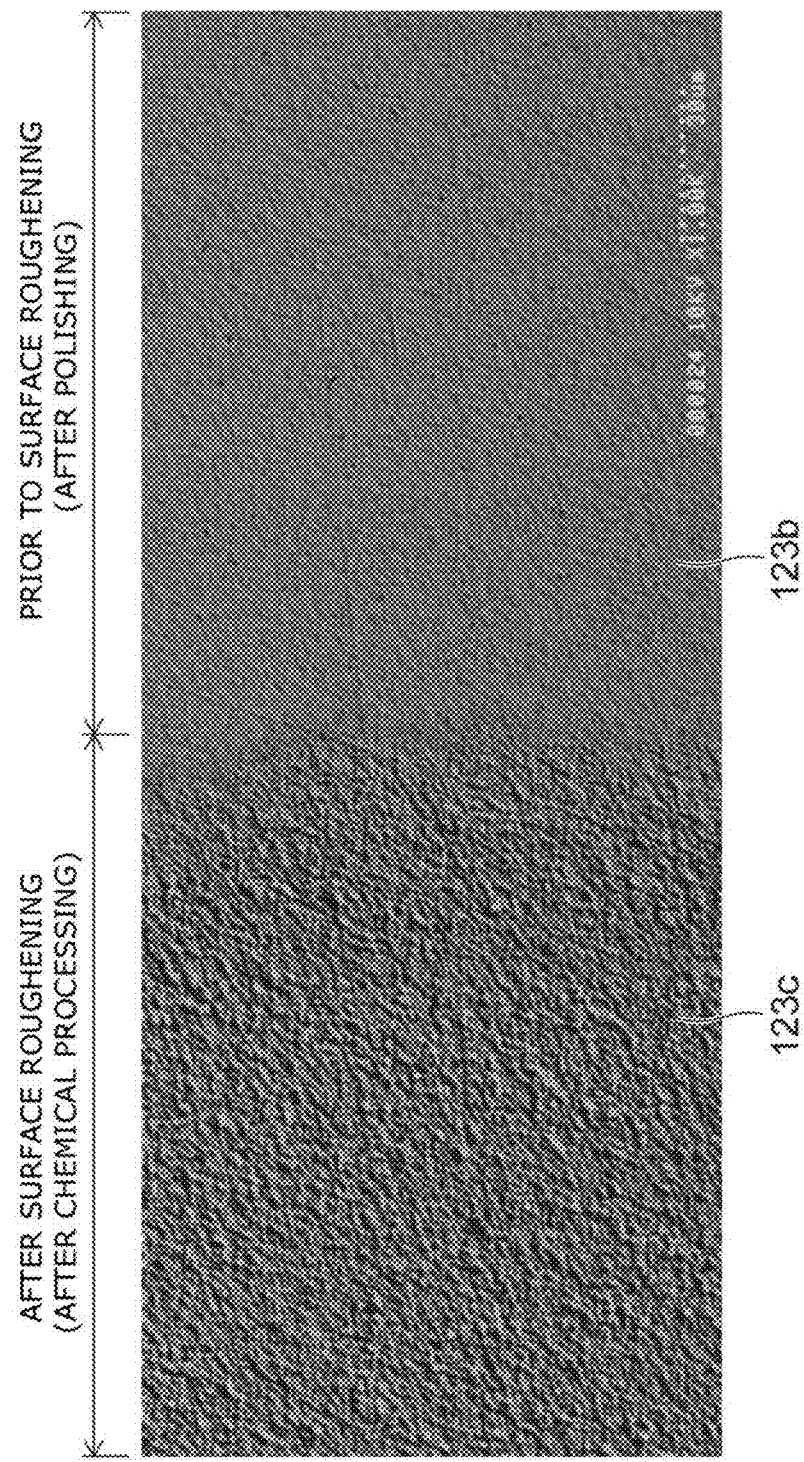
FIG. 3 shows photographs of surfaces of the layer structural component formed at the surface of the plasma-resistant member.

FIG. 3 shows photographs of surfaces of the layer structural component formed at the surface of the plasma-resistant member.

FIG. 4A to FIG. 4F are photographs of enlarged surfaces of the layer structural component formed at the surface of the plasma-resistant member.

FIG. 5A and FIG. 5B are photographs showing cross sections of the layer structural component formed at the surface of the plasma-resistant member.

FIG. 3 to FIG. 5B are photographs imaged by SEM (a Scanning Electron Microscope). FIG. 3 shows very low angle scattering reflection electron images.

The photograph on the left side of FIG. 3 shows the surface of a layer structural component 123c after surface roughening. The photograph on the right side of FIG. 3 shows the surface of a layer structural component 123b after polishing is performed prior to the surface roughening. For convenience of description, the layer structural component after the surface roughening is referred to as the "layer structural component 123c" in the following description. The layer structural component after the polishing is performed prior to the surface roughening is referred to as the "layer structural component 123b." The layer structural component in the state as deposited is referred to as the "layer structural component 123a." In the specification of the application, "as-deposited" refers to the state directly after the layer structural component including the yttria polycrystalline body is formed at the surface of the base member 121 prior to performing surface treatment (e.g., polishing).

FIG. 4A and FIG. 4B are photographs of the enlarged surface of the layer structural component 123a as-deposited. FIG. 4C and FIG. 4D are photographs of the enlarged surface of the layer structural component 123b after the polishing is performed prior to the surface roughening. FIG. 4E and FIG. 4F are photographs of the enlarged surface of the layer structural component 123c after the surface roughening. The enlargement ratio (10000 times) of the photographs shown in FIG. 4A, FIG. 4C, and FIG. 4E is different from the enlargement ratio (50000 times) shown in FIG. 4B, FIG. 4D, and FIG. 4F. FIG. 4C and FIG. 4E are photographs in which a first position of the surface is imaged for the layer structural components 123a, 123b, and 123c. That is, FIG. 4C is a photograph showing the state in which the polishing is performed for the surface of the layer structural component 123a shown in FIG. 4A. FIG. 4E is a photograph showing the state in which surface roughening of the surface of the layer structural component 123b shown in FIG. 4C is performed. FIG. 4B, FIG. 4D, and FIG. 4F are photographs in which a second position of the surface is imaged for the layer structural components 123a, 123b, and 123c. That is, FIG. 4D is a photograph showing the state in which the polishing is performed for the surface of the layer structural component 123a shown in FIG. 4B. FIG. 4F is a photograph showing the state in which surface roughening of the surface of the layer structural component 123b shown in FIG. 4D is performed.

FIG. 5A is a photograph showing the cross section of the layer structural component 123b after the polishing is performed prior to the surface roughening. FIG. 5B is a photograph showing the cross section of the layer structural component 123c after the surface roughening.

The inventor performed the surface roughening of the surface of the layer structural component 123b formed at the surface of the plasma-resistant member 120 by performing chemical processing of the layer structural component 123b.

In the specification of the application, "chemical processing" refers to processing of the surface of the object using a substance that produces hydrogen ions in an aqueous solution. For example, as the chemical processing, surface treatment using an aqueous solution including at least one of hydrobromic acid, hydroiodic acid, hypochlorous acid, chlorous acid, chloric acid, perchloric acid, sulfuric acid, fluorosulfonic acid, nitric acid, hydrochloric acid, phosphoric acid, fluoroantimonic acid, tetrafluoroboric acid, hexafluorophosphoric acid, chromic acid, boric acid, methanesulfonic acid, ethanesulfonic acid, benzenesulfonic acid, p-toluenesulfonic acid, trifluoromethanesulfonic acid, polystyrenesulfonic acid, acetic acid, citric acid, formic acid, gluconic acid, lactic acid, oxalic acid, tartaric acid, hydrofluoric acid, carbonic acid, or hydrogen sulfide may be used.

Or, in the specification of the application, "chemical processing" refers to processing of the surface of the object using a substance that produces hydroxide ions in an aqueous solution. For example, as the chemical processing, surface treatment using an aqueous solution including at least one of sodium hydroxide, potassium hydroxide, ammonia, calcium hydroxide, barium hydroxide, copper hydroxide, aluminum hydroxide, or iron hydroxide may be used.

The inventor observed the layer structural component 123b after the polishing prior to the surface roughening and the layer structural component 123c after the surface roughening. The photographs of the images of the layer structural component 123b after the polishing prior to the surface roughening and the layer structural component 123c after the surface roughening are as shown in FIG. 3 to FIG. 5B.

In other words, as shown in FIG. 3, the surface of the layer structural component 123c for which the chemical processing is performed has more surface roughening compared to the surface of the layer structural component 123b after the polishing is performed prior to the chemical processing being performed. In other words, the surface of the layer structural component 123c for which the chemical processing is performed has a deeper uneven structure than the surface of the layer structural component 123b after the polishing is performed prior to the chemical processing being performed.

As shown in FIG. 4A, FIG. 4B, FIG. 4E, FIG. 4F, and FIG. 5B, the layer structural component 123a as-deposited and the layer structural component 123c for which the chemical processing is performed have a relatively large first uneven structure 125 on the order of several hundred nm (e.g., about 100 to 500 nm) and a relatively small second uneven structure 126 on the order of several tens of nm (e.g., about 10 to 50 nm). In other words, the first uneven structure 125 has a large waviness compared to the second uneven structure 126. The second uneven structure 126 is formed to be superimposed onto the waviness of the first uneven structure 125 and has a roughness having a fine unevenness compared to the first uneven structure 125. For example, in the layer structural component 123c for which the chemical processing is performed, the second uneven structure having the unevenness having the fine crystal particle size is formed on substantially the entire surface of the surface of the layer structural component 123c; and the first uneven structure having voids where groups of crystal particles detached is formed here and there on the surface of the layer structural component 123c.

The second uneven structure 126 is formed to be superimposed onto the first uneven structure 125. Therefore, the layer structural component 123c for which the chemical processing is performed has a structure similar to a fractal structure in which the configuration of a portion is similar to the configuration of the entirety.

According to the embodiment, the interior wall of the chamber 110 can be covered substantially uniformly with the covering film to reduce the particles produced in the manufacturing processes of the semiconductor. The adhesion strength or adhesion force of the covering film can be increased. As described above, the layer structural components 123a and 123c have structures (structures similar to a fractal structure) in which the relatively small second uneven structure 126 is formed to be superimposed onto the relatively large first uneven structure 125. Therefore, the anchor effect due to the fine uneven structure is obtained; and a stable adhesion strength or adhesion force for the base member 121 can be obtained. The covering film that is formed on the layer structural components 123a and 123c for which the anchor effect is obtained can cause the reaction products, the particles, etc., to adhere to the surface of the covering film itself and be trapped with higher certainty. Thereby, the particles that are produced in the manufacturing processes of the semiconductor can be reduced.

Figure 6A:
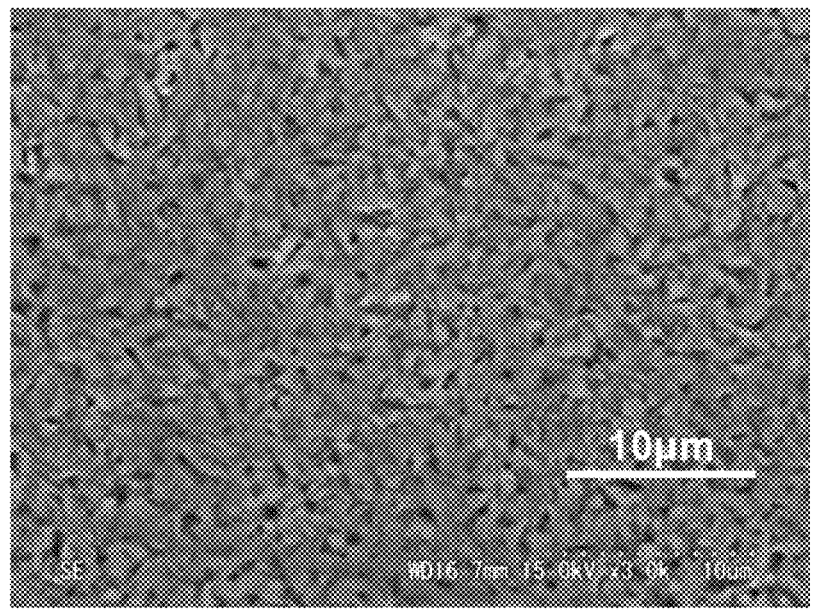
FIG. 6A and FIG. 6B are photographs showing other surfaces of the layer structural component formed at the surface of the plasma-resistant member.
Figure 6B:
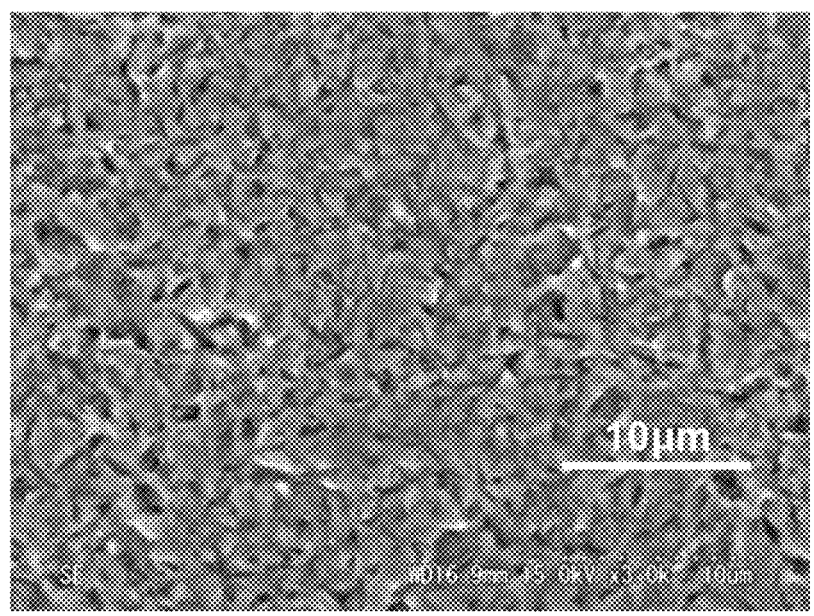

FIG. 6A and FIG. 6B are photographs showing other surfaces of the layer structural component formed at the surface of the plasma-resistant member.

FIG. 6A is a photograph showing the surface of the layer structural component 123c after a first physical processing is performed. FIG. 6B is a photograph showing the surface of the layer structural component 123c after a second physical processing is performed.

The inventor performed surface roughening of the surface of the layer structural component 123b by performing first physical processing or second physical processing of the layer structural component 123b formed at the surface of the plasma-resistant member 120.

In the specification of the application, "physical processing" refers to processing of the surface of the object by at least one of machining, laser patterning, electrical discharge machining, blasting, shot peening, or plasma processing. The inventor observed the layer structural component 123c after the surface roughening. The photographs that were imaged are as shown in FIG. 6A and FIG. 6B.

The surface of the layer structural component 123c for which the physical processing is performed has surface roughening similar to the surface of the layer structural component 123c for which the chemical processing is performed and has an uneven structure. Thereby, effects similar to those of the layer structural component 123c for which the chemical processing is performed are obtained.

The results of the inventor investigating the surface state of the layer structural component will now be described with reference to the drawings.

Figure 7A:
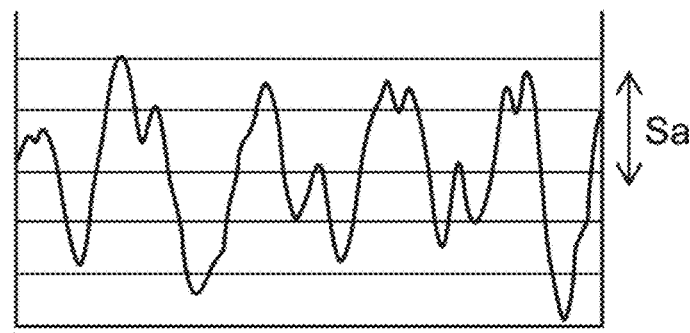
FIG. 7A to FIG. 7C are schematic views describing three-dimensional surface texture parameters.
Figure 7B:
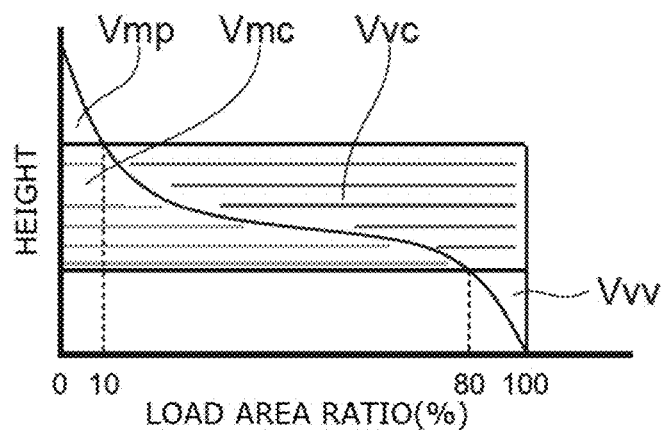
Figure 7C:
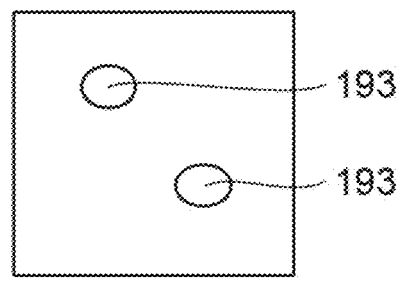

FIG. 7A to FIG. 7C are schematic views describing three-dimensional surface texture parameters.

FIG. 7A is a graph describing the average swing (arithmetic average) Sa in the height direction. FIG. 7B is a graph describing the core material volume Vmc and the core void volume Vvc. FIG. 7C is a schematic plan view describing the protrusion (or hole) density inside the segmentation that is defined.

The inventor investigated the expression and evaluation of the surface state for the layer structural components 123a and 123c formed at the surface of the plasma-resistant member 120 in a way that includes the entire surfaces of the layer structural components 123a and 123c. As shown in FIG. 7A, first, the inventor measured the average swing (arithmetic average) Sa in the height direction of the surfaces of the layer structural components 123a and 123c using a laser microscope.

An Olympus OLS4000 was used as the laser microscope. The magnification of the objective lens is 100 times. The zoom is 5 times. The cut-off was set to 2.5 μm or 0.8 μm.

The arithmetic average Sa is a three-dimensional expansion of a two-dimensional arithmetic average roughness Ra and is a three-dimensional roughness parameter (a three-dimensional height direction parameter). Specifically, the arithmetic average Sa is the volume of the portion between the surface configuration curved surface and the mean plane divided by the measured surface area. The arithmetic average Sa is defined by the following formula, where the mean plane is the xy surface, the vertical direction is the z-axis, and the measured surface configuration curve is z(x, y). Here, A in Formula (1) is the measured surface area.

[Formula 1]

$$Sa = \frac{1}{A} \int \int_A |z(x, y)| dx dy \tag{1}$$

Continuing as shown in FIG. 7B, the inventor investigated the core material volume Vmc determined from the load curve and the core void volume Vvc determined from the load curve. The parameters relating to the core material volume Vmc and the core void volume Vvc are defined as in the graph shown in FIG. 7B and are three-dimensional volume parameters. Namely, the height when the load area ratio is 10% is the boundary between the hill material volume Vmp and the core material volume Vmc and the core void volume Vvc. The height when the load area ratio is 80% is the boundary between the dale void volume Vvv and the core material volume Vmc and the core void volume Vvc. The hill material volume Vmp, the core material volume Vmc, the core void volume Vvc, and the dale void volume Vvv are volumes per unit surface area (units: $m^3/m^2$).

Continuing as shown in FIG. 7C, the inventor investigated the density of protrusions (or holes) 193 inside the defined segmentation. Specifically, the inventor investigated the protrusion summit density Sds and the developed interfacial area ratio Sdr. The protrusion summit density Sds and the developed interfacial area ratio Sdr are three-dimensional protrusion densities. The protrusion summit density Sds is the number of summits in the unit sampling plane. The protrusion summit density Sds is expressed by the following formula.

[Formula 2]
$$S_{ds} = \frac{\text{Number of Summits}}{(M-1)(N-1) \cdot \Delta x \cdot \Delta y} \quad (2)$$

The protrusion summit density Sds changes according to the definition of the summit. Therefore, it is necessary to distinctly define the summit when determining the protrusion summit density Sds.

The developed interfacial area ratio Sdr is a parameter of the rate of increase of the interface with respect to the sampling plane. The developed interfacial area ratio Sdr is the value of the sum total of the developed area of small interfaces formed of four points divided by the measured surface area and is defined by the following formula. Here, A in Formula (3) is the surface area of the defined segmentation.

[Formula 3]
$$Sdr = \frac{1}{A}\left[\iint_A \sqrt{\left[1+\left(\frac{\partial Z(xy)}{\partial x}\right)^2+\left(\frac{\partial Z(xy)}{\partial y}\right)^2+\right]} - 1\, dxdy\right] \quad (3)$$

The inventor determined that it is possible to express and evaluate the surface states of the layer structural components 123a and 123c formed at the surface of the plasma-resistant member 120 in a way that includes the entire surfaces of the layer structural components 123a and 123c by using the arithmetic average Sa, the core material volume Vmc, the core void volume Vvc, the protrusion summit density Sds, and the developed interfacial area ratio Sdr described above.

Figure 8:
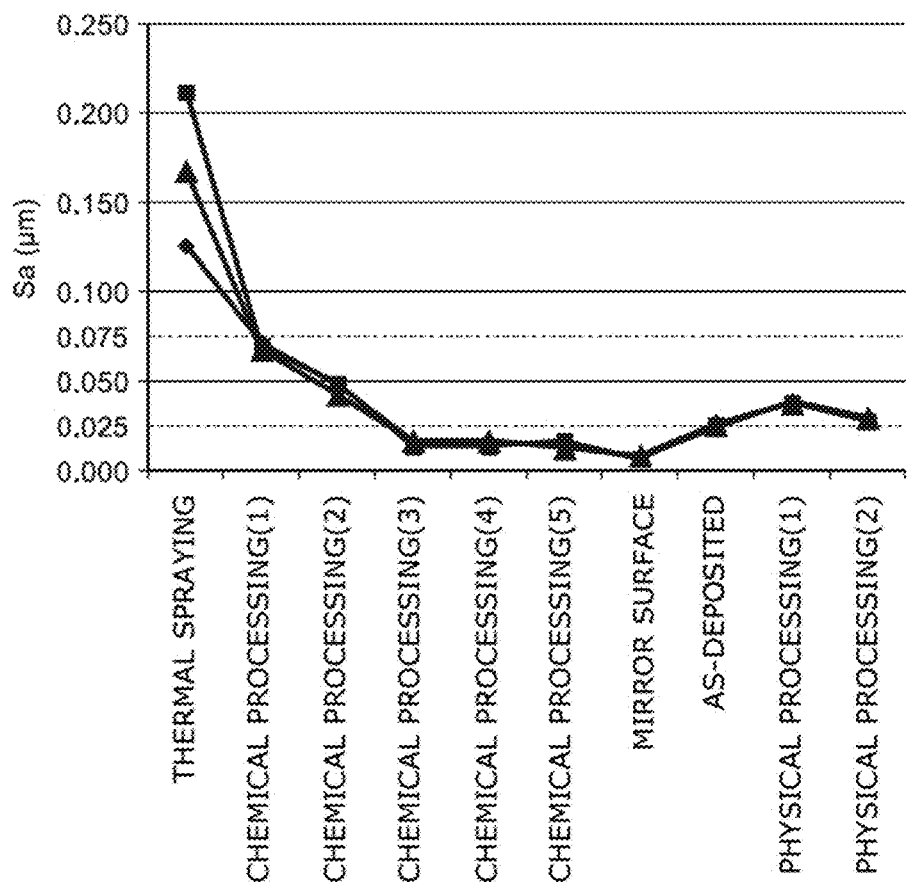
FIG. 8 is a graph of the arithmetic average of the surface of the layer structural component.

FIG. 8 is a graph of the arithmetic average of the surface of the layer structural component.

The inventor measured the arithmetic average Sa of the surface of the layer structural component using a laser microscope. The cut-off is 2.5 µm. The results are as shown in FIG. 8. The horizontal axis of the graph shown in FIG. 8 is the different states of the layer structural component formed at the surface of the plasma-resistant member 120. The vertical axis of the graph shown in FIG. 8 is the arithmetic average Sa (µm).

"Thermal spraying" of the horizontal axis of the graph of FIG. 8 is the yttria thermal-sprayed film. "Mirror surface" of the horizontal axis of the graph of FIG. 8 is mirror polishing performed on the surface of the layer structural component 123a including the yttria polycrystalline body.

The layer structural component 123c described above in regard to FIG. 3 to FIG. 5B corresponds to "chemical processing (2)". The layer structural component 123a described above in regard to FIG. 3 to FIG. 5B corresponds to "as-deposited." The layer structural component 123c described above in regard to FIG. 6A corresponds to "physical processing (1)". The layer structural component 123c described above in regard to FIG. 6B corresponds to "physical processing (2)".

The three curves shown in the graph of FIG. 8 are for the data when measurements are performed three times inside the one sample. That is, the three curves shown in the graph of FIG. 8 are for the number n of the measurements (n=3 in the graph of FIG. 8). This is also similar for the graphs described below in regard to FIG. 9 to FIG. 12B.

According to the graph shown in FIG. 8, the arithmetic average Sa for each of "chemical processing (1)," "chemical processing (2)," "as-deposited," "physical processing (1)," and "physical processing (2)" is within the range not less than 0.025 µm and not more than 0.075 µm. In the graph shown in FIG. 8, the arithmetic average Sa of "as-deposited" is 0.026 µm. In the graph shown in FIG. 8, the arithmetic average Sa of "physical processing (2)" is 0.030 µm.

Figure 9:
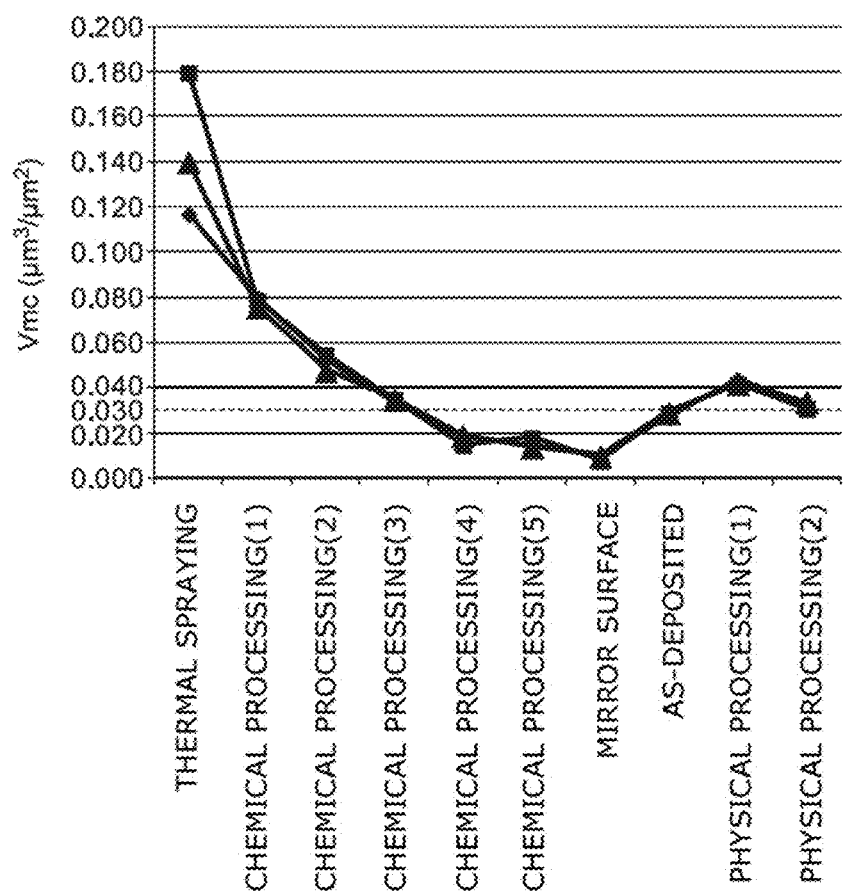
FIG. 9 is a graph of the core material volume of the surface of the layer structural component.

FIG. 9 is a graph of the core material volume of the surface of the layer structural component.

The inventor determined the core material volume Vmc of the surface of the layer structural component from the load curve. The cut-off is 2.5 µm. The results are as shown in FIG. 9. The horizontal axis of the graph shown in FIG. 9 is the different states of the layer structural component formed at the surface of the plasma-resistant member 120. The horizontal axis of the graph shown in FIG. 9 is similar to the horizontal axis of the graph shown in FIG. 8. The vertical axis of the graph shown in FIG. 9 is the core material volume Vmc ($\mu m^3/\mu m^2$) determined from the load curve.

According to the graph shown in FIG. 9, the core material volume Vmc for each of "chemical processing (1)," "chemical processing (2)," "chemical processing (3)," "as-deposited," "physical processing (1)," and "physical processing (2)" is within the range not less than 0.03 $\mu m^3/\mu m^2$ and not more than 0.08 $\mu m^3/\mu m^2$.

Figure 10:
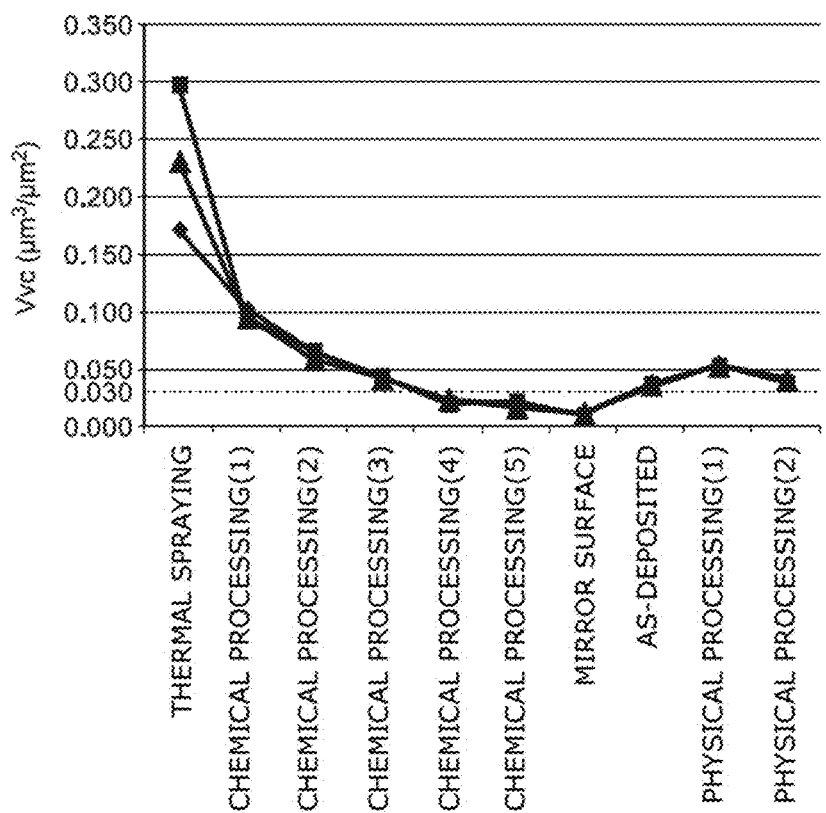
FIG. 10 is a graph of the core void volume of the surface of the layer structural component.

FIG. 10 is a graph of the core void volume of the surface of the layer structural component.

The inventor determined the core void volume Vvc of the surface of the layer structural component from the load curve. The cut-off is 2.5 µm. The results are as shown in FIG. 10. The horizontal axis of the graph shown in FIG. 10 is the different states of the layer structural component formed at the surface of the plasma-resistant member 120. The horizontal axis of the graph shown in FIG. 10 is similar to the horizontal axis of the graph shown in FIG. 8. The vertical axis of the graph shown in FIG. 10 is the core void volume Vvc ($\mu m^3/\mu m^2$) determined from the load curve.

According to the graph shown in FIG. 10, the core void volume Vvc for each of "chemical processing (1)," "chemical processing (2)," "chemical processing (3)," "as-deposited," "physical processing (1)," and "physical processing (2)" is within the range not less than 0.03 $\mu m^3/\mu m^2$ and not more than 0.1 $\mu m^3/m^2$.

Figure 11:
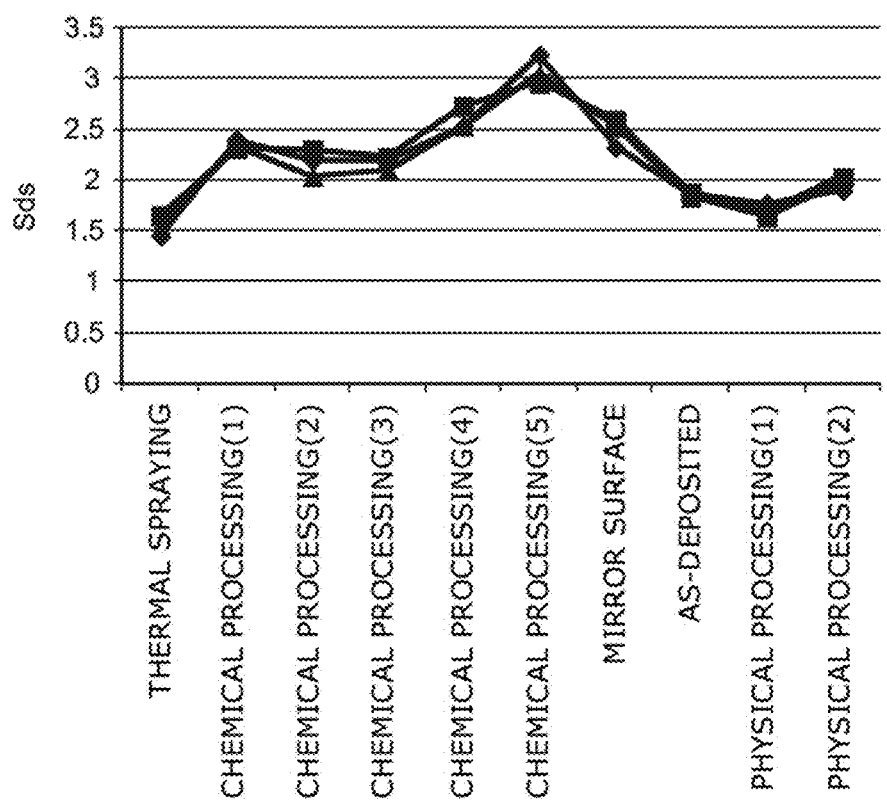
FIG. 11 is a graph of the density of the protrusion summits of the surface of the layer structural component.

FIG. 11 is a graph of the density of the protrusion summits of the surface of the layer structural component.

The inventor determined the protrusion summit density Sds of the surface of the layer structural component. The cut-off is 2.5 µm. The results are as shown in FIG. 11. The horizontal axis of the graph shown in FIG. 11 is the different states of the layer structural component formed at the surface of the plasma-resistant member 120. The horizontal axis of the graph shown in FIG. 11 is similar to the horizontal axis of the graph shown in FIG. 8. The vertical axis of the graph shown in FIG. 11 is the protrusion summit density Sds.

In the graph shown in FIG. 11, a substantial difference was not found for the protrusion summit density Sds between the forms of the layer structural component.

Figure 12A:
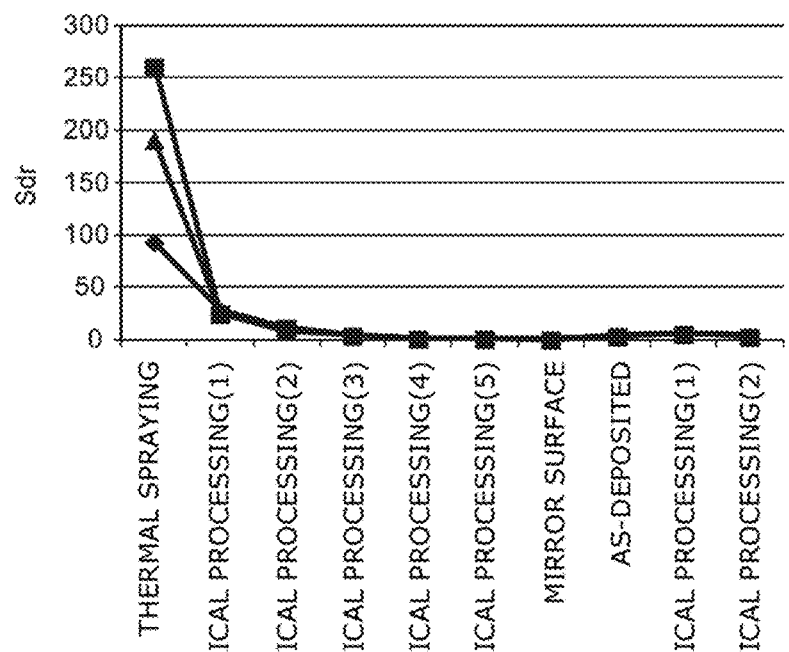
FIG. 12A and FIG. 12B are graphs of the developed interfacial area ratio of the surface of the layer structural component.
Figure 12B:
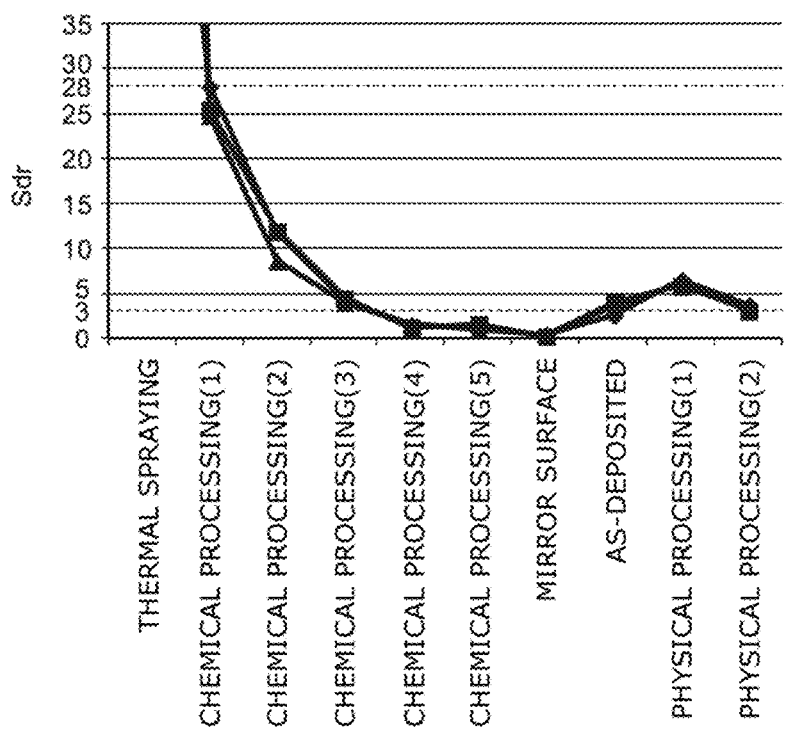

FIG. 12A and FIG. 12B are graphs of the developed interfacial area ratio of the surface of the layer structural component.

FIG. 12A is a graph displaying the developed interfacial area ratio having a range not less than 0 and not more than 300. FIG. 12B is a graph displaying an enlarged range of the developed interfacial area ratio of not less than 0 and not more than 35.

The inventor determined the developed interfacial area ratio Sdr of the surface of the layer structural component. The cut-off is 2.5 μm. The results are as shown in FIG. 12A and FIG. 12B. The horizontal axis for the graphs shown in FIG. 12A and FIG. 12B is the different states of the layer structural component formed at the surface of the plasma-resistant member 120. The horizontal axis for the graphs shown in FIG. 12A and FIG. 12B is similar to the horizontal axis of the graph shown in FIG. 8. The vertical axis for the graphs shown in FIG. 12A and FIG. 12B is the developed interfacial area ratio Sdr.

According to the graphs shown in FIG. 12A and FIG. 12B, the developed interfacial area ratio Sdr for each of "chemical processing (1)," "chemical processing (2)," "chemical processing (3)," "as-deposited," "physical processing (1)," and "physical processing (2)" is within the range not less than 3 and not more than 28.

The results of the investigations of the state of the interior of the layer structural component by the inventor will now be described with reference to the drawings.

Figure 13:
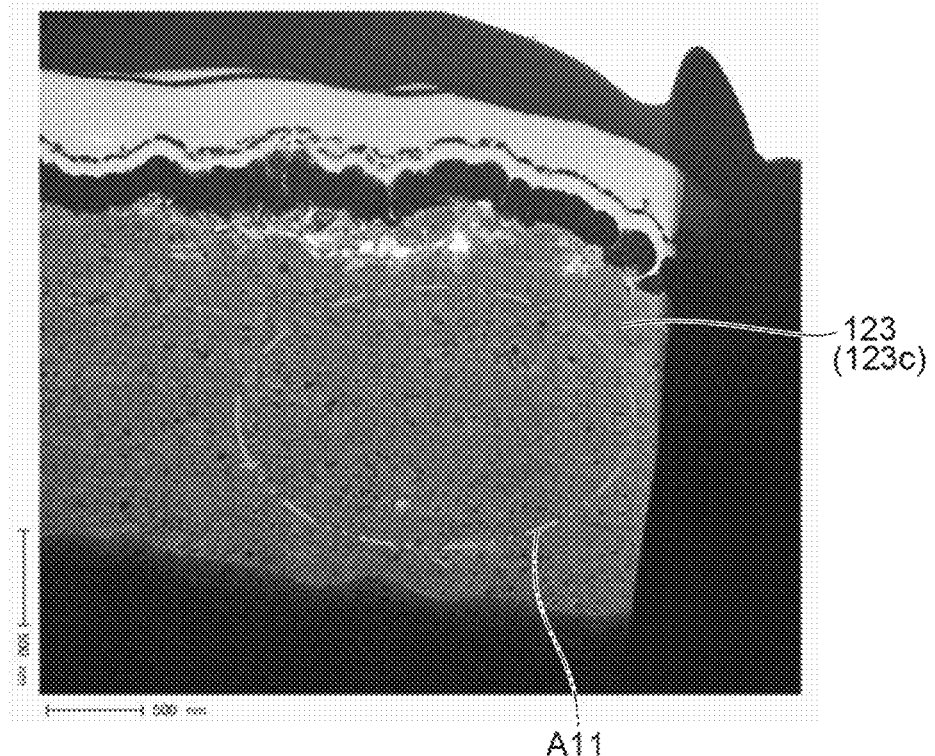
FIG. 13 is a photograph in which the state of the interior of the layer structural component of the embodiment is imaged.

FIG. 13 is a photograph in which the state of the interior of the layer structural component of the embodiment is imaged.

Figure 14:
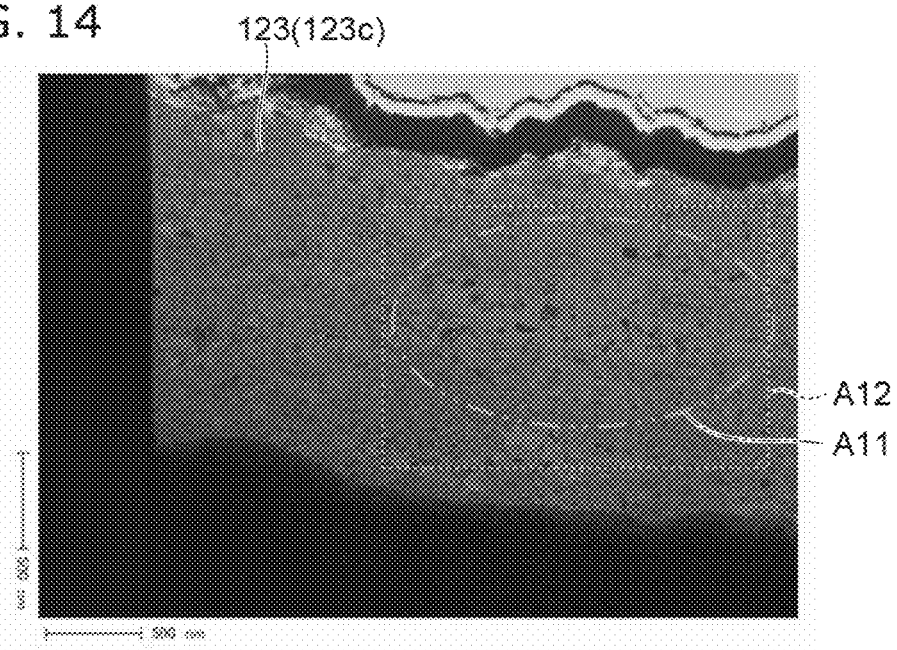
FIG. 14 is a photograph in which the internal structure of the layer structural component of the embodiment is binarized.

FIG. 14 is a photograph in which the internal structure of the layer structural component of the embodiment is binarized.

FIG. 13 and FIG. 14 are photographs imaged by TEM (Transmission Electron Microscope/Hitachi H-9000NAR). The binary processing was performed in region A12 shown in FIG. 14.

The layer structural component 123 (123c) shown in FIG. 13 includes the yttria polycrystalline body. The layer structural component 123 (123c) of the yttria polycrystalline body shown in FIG. 13 is formed by aerosol deposition. As described above in regard to FIG. 1 and FIG. 2, the layer structural component 123 of the yttria polycrystalline body formed by aerosol deposition has a dense structure compared to an yttria sintered body, an yttria thermal-sprayed film, etc.

On the other hand, a sparse and dense structure exists in the interior of the layer structural component 123 (123c) including the yttria polycrystalline body as in region A11 shown in FIG. 13 and region A12 shown in FIG. 14. That is, portions where the density is relatively sparse and portions where the density is relatively dense exist in the interior of the layer structural component 123 (123c). In region A12 shown in FIG. 14, the sparseness and denseness of the density of the yttria polycrystalline body is illustrated by binarized shading. The portions having the light color are the portions where the density is sparse.

In the case where the interior wall of the chamber 110 is covered with the covering film as in the manufacturing processes of the semiconductor described above in regard to FIG. 2, it is necessary to increase the adhesion strength or adhesion force of the covering film so that the covering film does not peel easily.

Because the sparse and dense structure of the yttria polycrystalline body exists in the interior of the layer structural component 123 (123c) shown in FIG. 13, the relatively large first uneven structure 125 on the order of several hundred nm and the relatively small second uneven structure 126 on the order of several tens of nm are formed easily by the chemical processing or the physical processing. In other words, compared to the portions where the density is dense, the portions where the density is sparse are eroded easily by the chemical processing, etc. Compared to the portions where the density is dense, the portions where the density is sparse are eroded first. Therefore, it is considered that the second uneven structure 126 is easily formed to be superimposed onto the first uneven structure 125. Thereby, the adhesion strength or adhesion force of the covering film can be increased.

As described above in regard to FIG. 4E and FIG. 4F, the first uneven structure 125 and the second uneven structure 126 are distributed in the surface of the layer structural component 123c. On the other hand, as shown in FIG. 13 and FIG. 14, the portions where the density is relatively sparse and the portions where the density is relatively dense are distributed in the thickness direction (the depth direction) of the layer structural component 123c. Thus, the sparse and dense structure of the layer structural component 123c of the embodiment has a structure in which the sparse portions having densities lower than the densities of the dense portions are distributed three-dimensionally inside the dense portions. For example, the layer structural component 123c of the embodiment has a three-dimensional mesh structure. The layer structural component 123c of the embodiment may have an ant-nest structure or a coral-reef structure. Thereby, the adhesion strength or adhesion force of the covering film can be increased further.

FIG. 15A to FIG. 15E are photographs in which the state of the upper portion of the layer structural component of the embodiment is imaged.

FIG. 16A and FIG. 16B are a graph and a table showing an example of the surface area ratio with respect to the depth position.

FIG. 15A to FIG. 15E are photographs of the state of the upper portion (the upper layer) of the layer structural component of the embodiment imaged by TEM (Hitachi HD-2700). FIG. 16A is a graph of the example of the surface area ratio with respect to the depth position. FIG. 16B is a table showing the example of the surface area ratio with respect to the depth position.

Figure 15A:
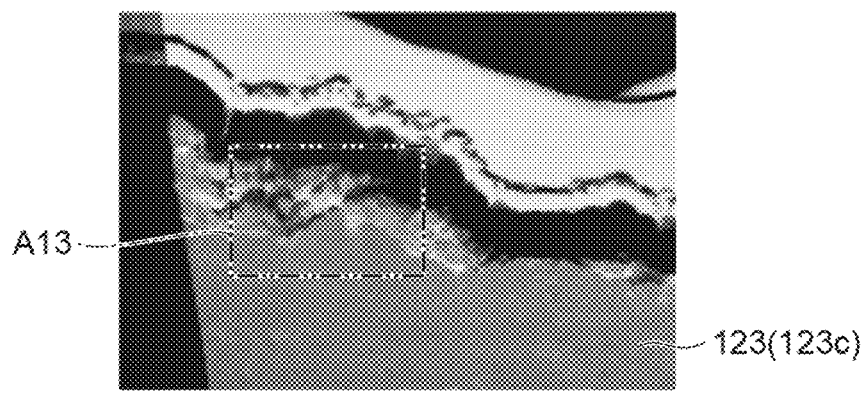
FIG. 15A to FIG. 15E are photographs in which the state of the upper portion of the layer structural component of the embodiment is imaged.
Figure 15B:
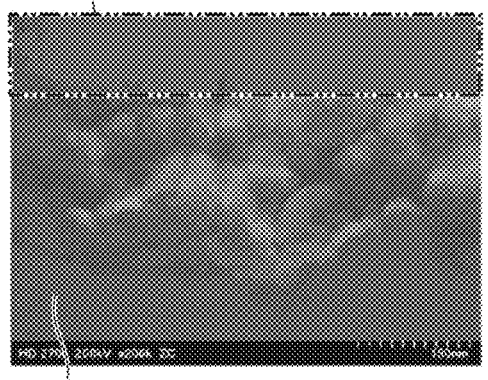
Figure 15C:
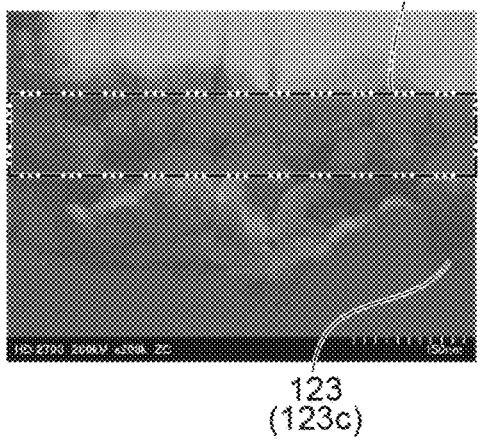
Figure 15D:
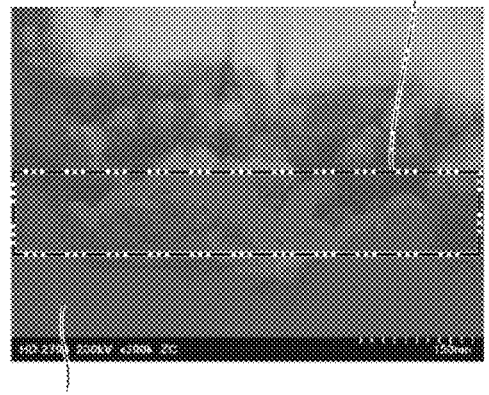
Figure 15E:
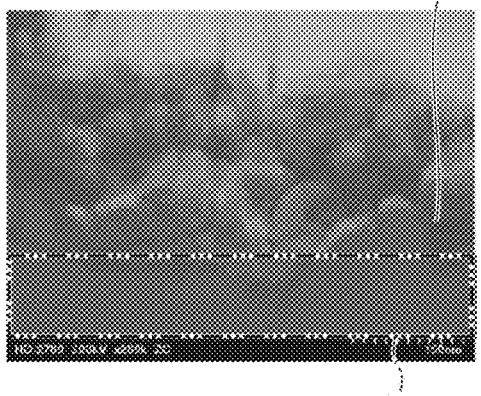

FIG. 15B is a photograph in which region A131 shown in FIG. 15B of region A13 shown in FIG. 15A is binarized. FIG. 15C is a photograph in which region A132 shown in FIG. 15C of region A13 shown in FIG. 15A is binarized. FIG. 15D is a photograph in which region A133 shown in FIG. 15D of region A13 shown in FIG. 15A is binarized. FIG. 15E is a photograph in which region A134 shown in FIG. 15E of region A13 shown in FIG. 15A is binarized. That is, the regions where the binary processing is performed are in the order of region A131 shown in FIG. 15B, region A132 shown in FIG. 15C, region A133 shown in FIG. 15D, and region A134 shown in FIG. 15E from the upper layer (the relatively shallow layer from the surface) toward the lower layer (the relatively deep layer from the surface).

"Depth position (1)" shown in FIG. 16A and FIG. 16B corresponds to region A131 shown in FIG. 15B. "Depth position (2)" shown in FIG. 16A and FIG. 16B corresponds to region A132 shown in FIG. 15C. "Depth position (3)" shown in FIG. 16A and FIG. 16B corresponds to region A133 shown in FIG. 15D. "Depth position (4)" shown in FIG. 16A and FIG. 16B corresponds to region A134 shown in FIG. 15E.

The layer structural component 123c shown in FIG. 15A to FIG. 15E includes the yttria polycrystalline body. The layer structural component 123c of the yttria polycrystalline body shown in FIG. 15A to FIG. 15E is formed by aerosol deposition. Chemical processing of the surface of the layer structural component 123c is performed. The sparseness and denseness of the density of the layer structural component 123 (123c) including the yttria polycrystalline body is illustrated by binarized shading. The portions having the light color are the portions where the density is sparse.

According to the photographs having the binary processing shown in FIG. 15B to FIG. 15E, the portions of the layer structural component 123c where the density is sparse become smaller from the upper layer toward the lower layer. That is, the recesses of the uneven structure of the layer structural component 123c become smaller from the upper layer toward the lower layer. In other words, the fine trenches of the surface of the layer structural component 123c become finer from the upper layer toward the lower layer.

Specifically, as shown in FIG. 16A and FIG. 16B, the surface area ratio of each of depth positions (1) to (4) are 87.41%, 34.84%, 22.70%, and 2.56% and decrease from depth position (1) toward depth position (4).

Thereby, effects similar to the effects described above in regard to FIG. 13 and FIG. 14 are obtained.

The results of investigations of the adhesion strength of the pre-coated film by the inventor will now be described with reference to the drawings.

FIG. 17 is a schematic perspective view describing the method for measuring the adhesion strength of the pre-coated film.

FIG. 18A to FIG. 18D are photographs describing the method for measuring the adhesion strength of the pre-coated film.

Figure 19A:
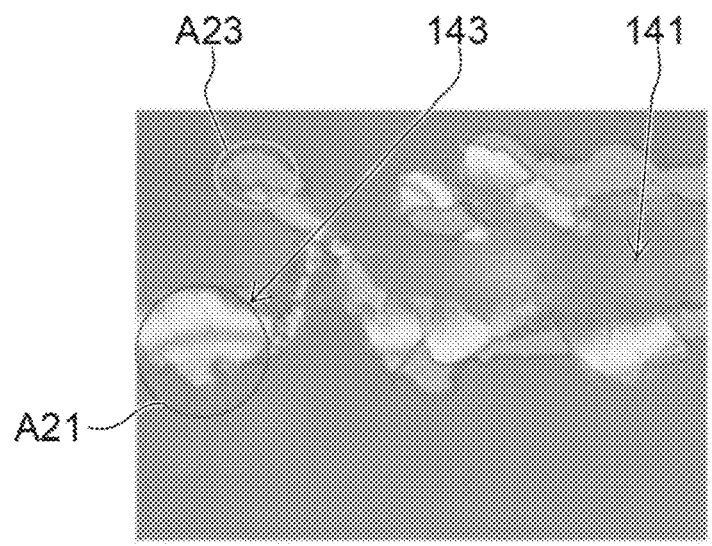
FIG. 19A and FIG. 19B are photographs showing optical microscope photographs.
Figure 19B:
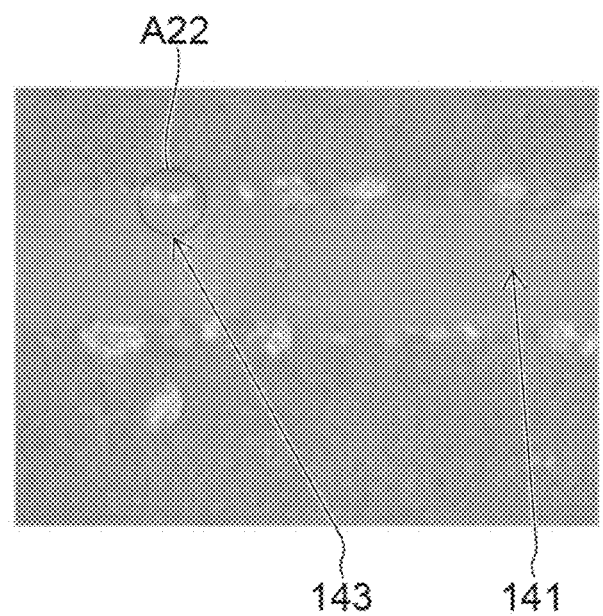

FIG. 19A and FIG. 19B are photographs showing optical microscope photographs.

Figure 20A:
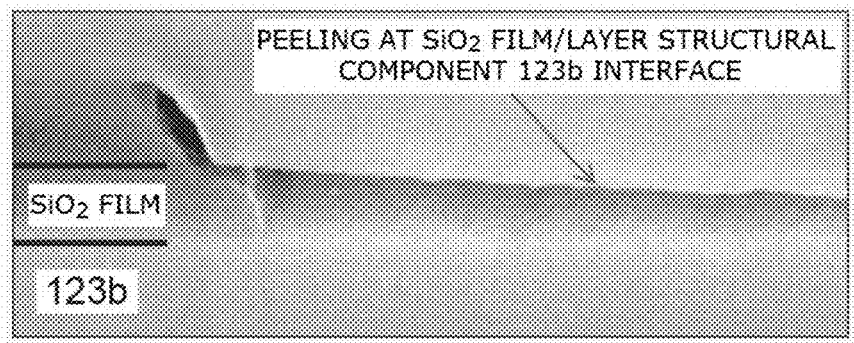
FIG. 20A and FIG. 20B are photographs in which the peeling region is imaged by SEM.
Figure 20B:
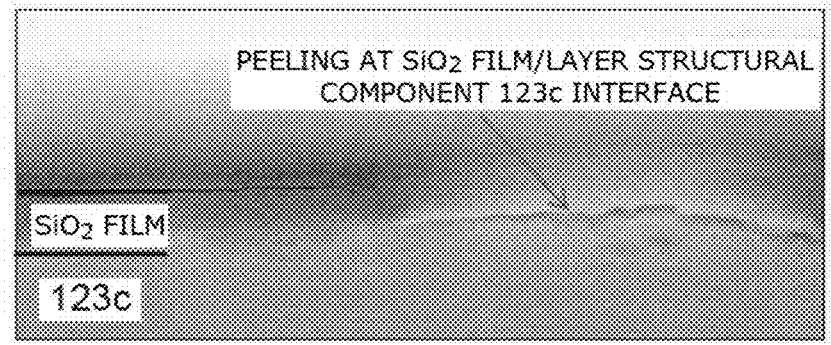

FIG. 20A and FIG. 20B are photographs in which the peeling region is imaged by SEM.

FIG. 19A is a photograph showing a scratch mark and a peeling region of the covering film formed at the surface of the layer structural component 123b. FIG. 19B is a photograph showing a scratch mark and a peeling region of the covering film formed at the surface of the layer structural component 123c.

FIG. 20A is a photograph in which region A21 shown in FIG. 19A is imaged by SEM. FIG. 20B is a photograph in which region A22 shown in FIG. 19B is imaged by SEM.

First, the inventor formed the covering film (in this specific example, a film of $SiO_2$) on the surface of the layer structural component 123 by CVD. The thickness of the covering film is about 0.4 to 0.6 µm.

Continuing, the inventor measured the adhesion strength of the pre-coated film (the covering film) by a method called nanoscratch testing, etc. Specifically, a Nano Scratch Tester (NST) of CSM Instruments was used as the scratch tester. The loading velocity is 30 newton/minute (N/min). As illustrated by arrow A2 shown in FIG. 17, in this measurement method, the load is applied to the covering film formed at the surface of the layer structural component 123 via an indenter 251. Continuing as illustrated by arrow A3 shown in FIG. 17, the indenter 251 is moved along the surface of the layer structural component 123 and the adhesion strength is measured while continuously increasing the applied load. The material of the tip of the indenter 251 is diamond. The curvature radius of the tip of the indenter 251 is 100 µm.

Figure 18A:
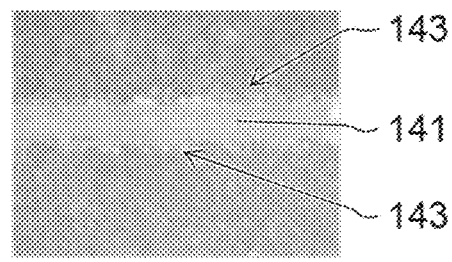
FIG. 18A to FIG. 18D are photographs describing the method for measuring the adhesion strength of the pre-coated film.

Continuing as shown in FIG. 18A, a photograph was acquired by an optical microscope directly before the point where the peeling (the damage) of substantially the entire covering film starts. A scratch mark 141 and peeling regions 143 are shown in FIG. 18A. Other examples of the photographs acquired by the optical microscope are as shown in FIG. 19A and FIG. 19B. As shown in FIG. 20A, it can be seen that peeling occurs at the interface between the covering film and the layer structural component 123b for the layer structural component 123b after the polishing prior to the surface roughening. As shown in FIG. 20B, it can be seen that peeling occurs at the interface between the covering film and the layer structural component 123c for the layer structural component 123c after the surface roughening. It was found that there is no covering film in region A23 shown in FIG. 19A.

Figure 18B:
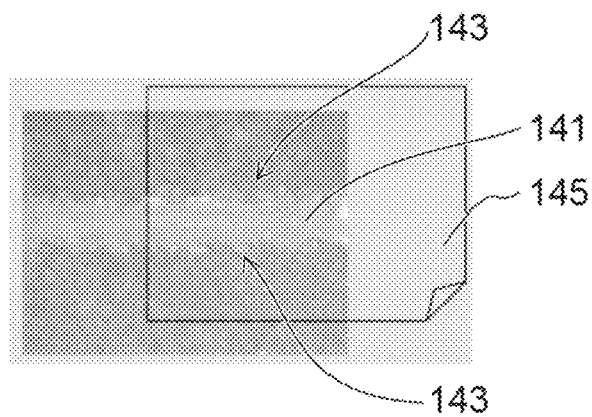

Continuing as shown in FIG. 18B, an OHP sheet 145 was placed on the acquired optical microscope photograph.

Figure 18C:
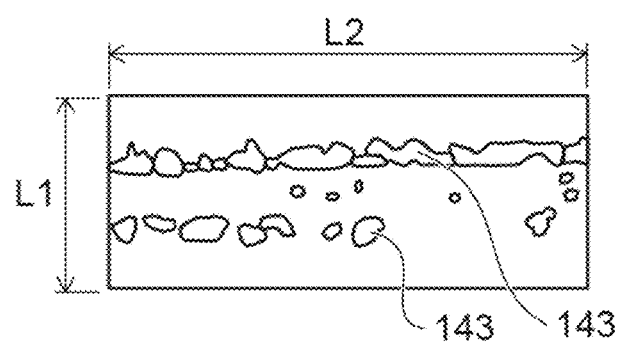

Continuing as shown in FIG. 18C, the peeling regions 143 of the covering film were traced using, for example, a writing implement such as a marker, etc., in a prescribed region having the scratch mark 141 as substantially the center. In this specific example, a length L1 of one side of the prescribed region is 70 µm. For the prescribed region, a length L2 of one other side substantially orthogonal to the one side of 70 µm is 170 µm.

Figure 18D:
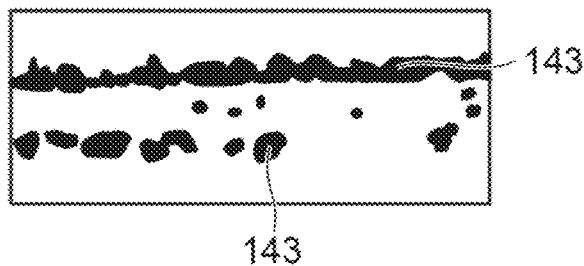

Continuing as shown in FIG. 18D, the traced peeling regions 143 were filled using, for example, image processing software; and binary processing of the image was performed. Mitani Corporation's WinROOF Ver. 6.5 was utilized as the image processing software.

Continuing, the surface area ratio of the peeling regions 143 of the covering film was calculated.

Figures 21A, 21B:
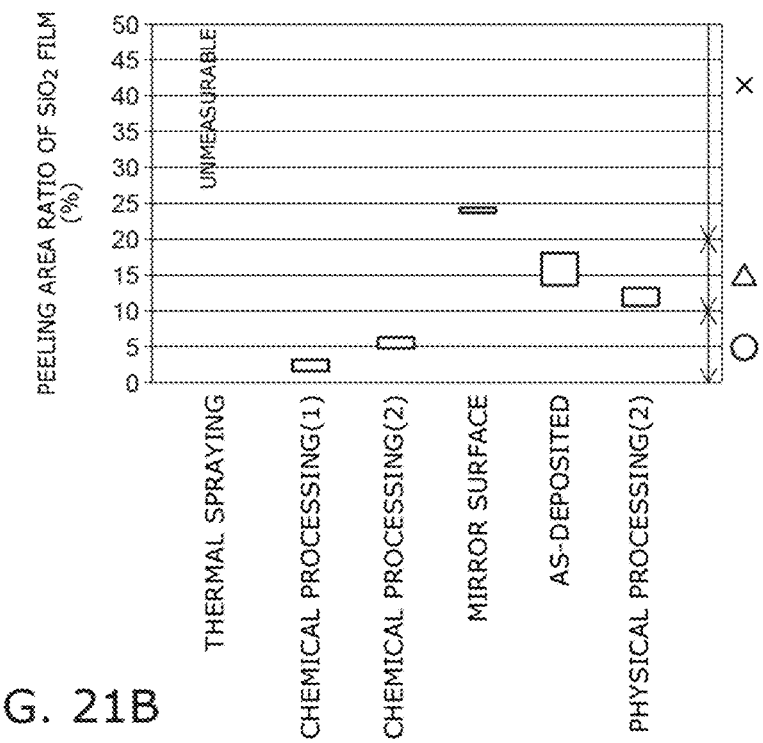
FIG. 21A and FIG. 21B are a table and a graph of an example of the measurement results of the adhesion strength of the pre-coated film.

FIG. 21A and FIG. 21B are a table and a graph of an example of the measurement results of the adhesion strength of the pre-coated film.

FIG. 21A is a table showing the example of the measurement results of the adhesion strength of the pre-coated film. FIG. 21B is a graph of the example of the measurement results of the adhesion strength of the pre-coated film.

The inventor calculated the peeling area ratio (%) of the covering film (in this specific example, the film of $SiO_2$) by the measurement method described above in regard to FIG. 17 to FIG. 20B. The evaluation of the peeling area ratio of the film and the adhesion strength of the covering film is as shown in FIG. 21A and FIG. 21B. The horizontal axis of the graph shown in FIG. 21B is the different states of the layer structural component formed at the surface of the plasma-resistant member 120. The vertical axis on the left side of the graph shown in FIG. 21B is the peeling area ratio (%) of the covering film. The vertical axis on the right side of the graph shown in FIG. 21B is the evaluation of the adhesion strength of the covering film.

The inventor determined the adhesion strength of the covering film to be "superior (○): OK" in the case where the peeling area ratio of the covering film is within the range not less than 0% but less than 10%. The inventor determined the adhesion strength of the covering film to be "good (Δ): OK" in the case where the peeling area ratio of the covering film is within the range not less than 10% but less than 20%. The inventor determined the adhesion strength of the covering film to be "no good (x): NG" in the case where the peeling area ratio of the covering film is 20% or more. According to FIG. 21A and FIG. 21B, the peeling area ratio of the covering film for each of "chemical processing (1)," "chemical processing (2)," "as-deposited," and "physical processing (2)" are within the range not less than 0% but less than 20%.

For "thermal spraying," the unevenness of the surface of the thermal-sprayed film is severe compared to the other surface treatments; and cracks occurred in the surface of the thermal-sprayed film. Also, many peeling locations exist in the surface of the thermal-sprayed film. Therefore, the peeling area ratio of the covering film for "thermal spraying" was unmeasurable.

Figure 22A:
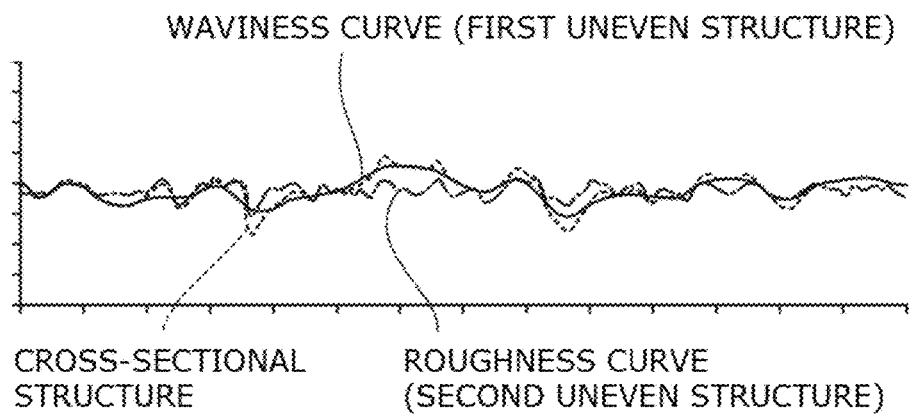
FIG. 22A and FIG. 22B are graphs describing the cut-off of the surface analysis.
Figure 22B:
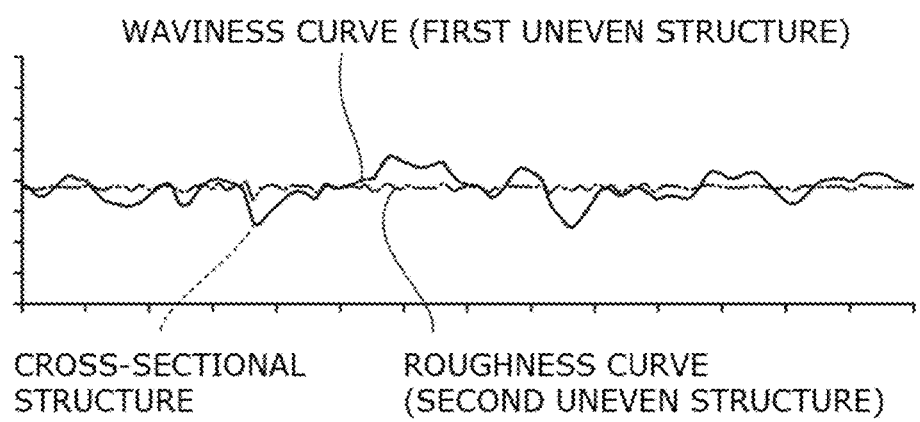

FIG. 22A and FIG. 22B are graphs describing the cut-off of the surface analysis.

FIG. 22A is a graph when the cut-off is set to 2.5 μm. FIG. 22B is a graph when the cut-off is set to 0.8 μm.

A profile curve illustrating the cross-sectional configuration of the surface, a waviness curve illustrating the first uneven structure 125, and a roughness curve illustrating the second uneven structure 126 are shown in each of FIG. 22A and FIG. 22B. As described above in regard to FIG. 4A to FIG. 4F, the first uneven structure 125 has a large waviness compared to the second uneven structure 126. The second uneven structure 126 has a roughness having a fine unevenness compared to the first uneven structure 125.

As shown in FIG. 22A, when the cut-off is set to 2.5 μm, the roughness curve due to the second uneven structure 126 exists in a range overlapping the waviness curve due to the first uneven structure 125.

Conversely, as shown in FIG. 22B, when the cut-off is set to 0.8 μm, the waviness curve due to the first uneven structure 125 has a trend similar to the profile curve compared to when the cut-off is set to 2.5 μm. On the other hand, the range where the roughness curve due to the second uneven structure 126 overlaps the waviness curve due to the first uneven structure 125 is narrow compared to when the cut-off is set to 2.5 μm.

Thereby, it was confirmed that the waviness due to the first uneven structure 125 and the roughness due to the second uneven structure 126 can be isolated more distinctly by setting the cut-off of the surface analysis to 0.8 μm. That is, the first uneven structure 125 and the second uneven structure 126 can be discriminated more distinctly by setting the cut-off of the surface analysis to 0.8 μm.

Figure 23A:
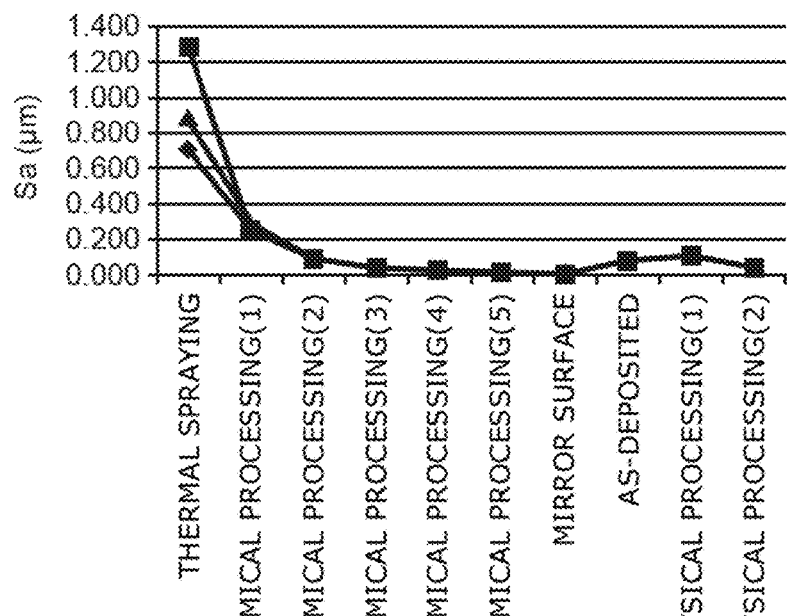
FIG. 23A and FIG. 23B are graphs of the arithmetic average of the surface of the layer structural component.
Figure 23B:
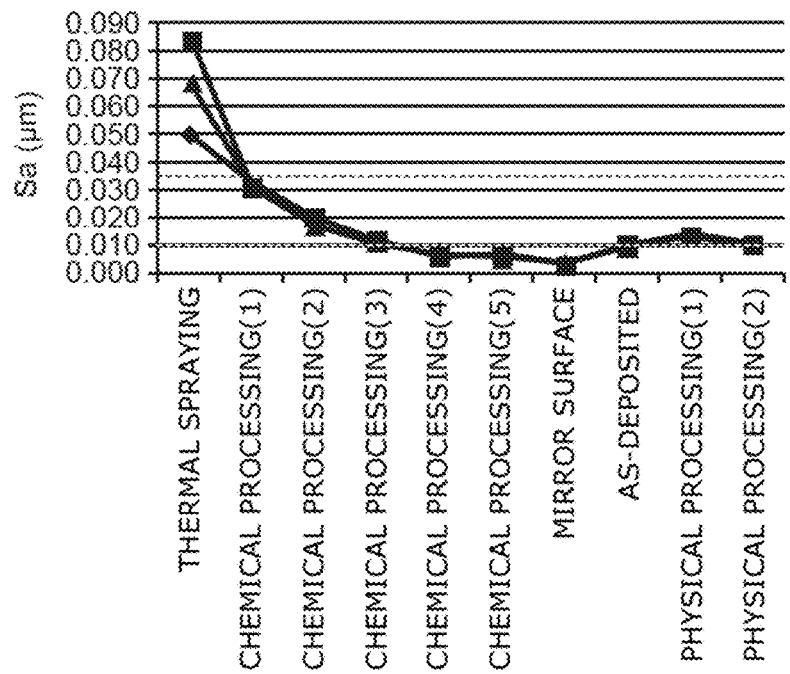

FIG. 23A and FIG. 23B are graphs of the arithmetic average of the surface of the layer structural component.

The inventor set the cut-off to 0.8 μm and measured the arithmetic average Sa of the surface of the layer structural component using a laser microscope. The results are as shown in FIG. 23A and FIG. 23B.

FIG. 23A is a graph of the arithmetic average of the first uneven structure 125. FIG. 23B is a graph of the arithmetic average of the second uneven structure 126. The horizontal axis for the graphs shown in FIG. 23A and FIG. 23B is the different states of the layer structural component formed at the surface of the plasma-resistant member 120. The horizontal axis for the graphs shown in FIG. 23A and FIG. 23B is similar to the horizontal axis of the graph shown in FIG. 8. The vertical axis for the graphs shown in FIG. 23A and FIG. 23B is the arithmetic average Sa (μm).

According to the graph shown in FIG. 23B, the arithmetic average Sa of the second uneven structure 126 for each of "chemical processing (1)," "chemical processing (2)," "chemical processing (3)," "as-deposited," "physical processing (1)," and "physical processing (2)" is within the range not less than 0.010 μm and not more than 0.035 μm.

Figure 24A:
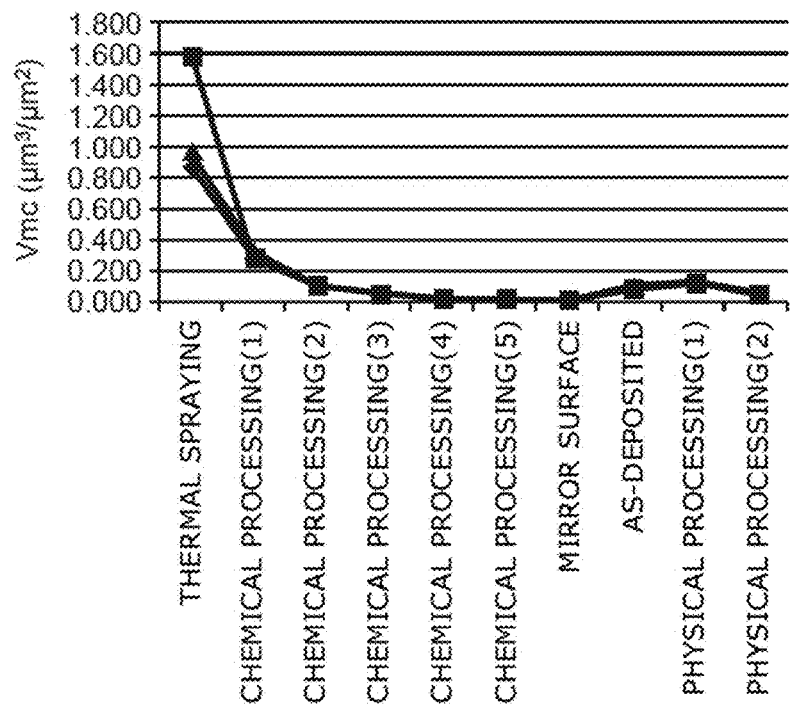
FIG. 24A and FIG. 24B are graphs of the core material volume of the surface of the layer structural component.
Figure 24B:
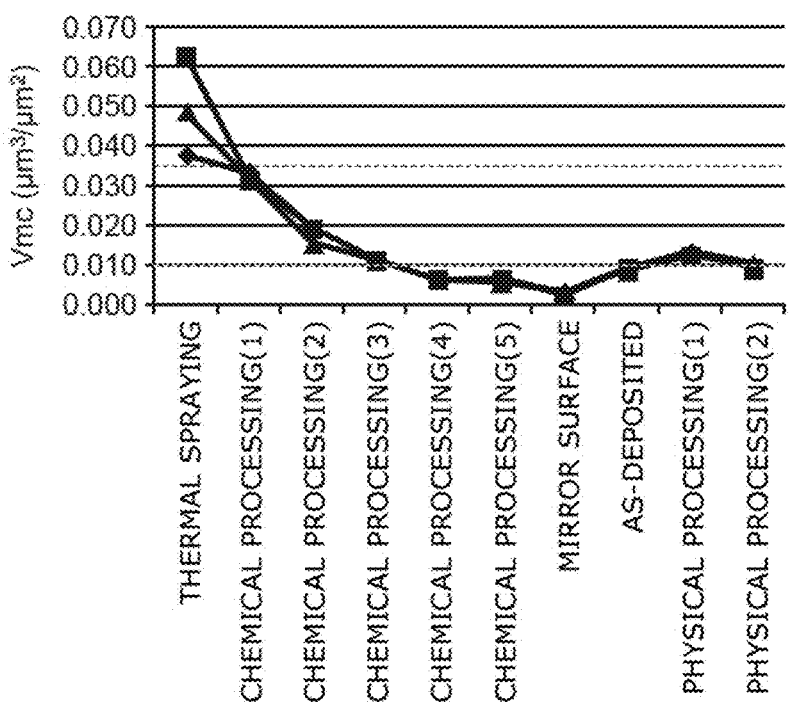

FIG. 24A and FIG. 24B are graphs of the core material volume of the surface of the layer structural component.

The inventor set the cut-off to 0.8 μm and determined the core material volume Vmc of the surface of the layer structural component from the load curve. The results are as shown in FIG. 24A and FIG. 24B.

FIG. 24A is a graph of the core material volume of the first uneven structure 125. FIG. 24B is a graph of the core material volume of the second uneven structure 126. The horizontal axis for the graphs shown in FIG. 24A and FIG. 24B is the different states of the layer structural component formed at the surface of the plasma-resistant member 120. The horizontal axis for the graphs shown in FIG. 24A and FIG. 24B is similar to the horizontal axis of the graph shown in FIG. 8. The vertical axis for the graphs shown in FIG. 24A and FIG. 24B is the core material volume Vmc ($\mu m^3/\mu m^2$) determined from the load curve.

According to the graph shown in FIG. 24B, the core material volume Vmc of the second uneven structure 126 for each of "chemical processing (1)," "chemical processing (2)," "chemical processing (3)," "as-deposited," "physical processing (1)," and "physical processing (2)" is within the range not less than 0.01 $m^3/\mu m^2$ and not more than 0.035 $m^3/m^2$.

Figure 25A:
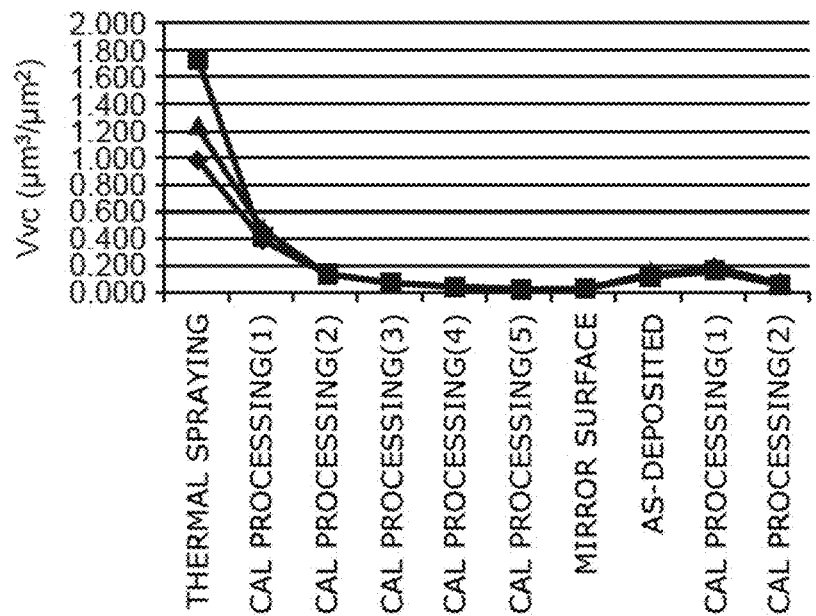
FIG. 25A and FIG. 25B are graphs of the core void volume of the surface of the layer structural component.
Figure 25B:
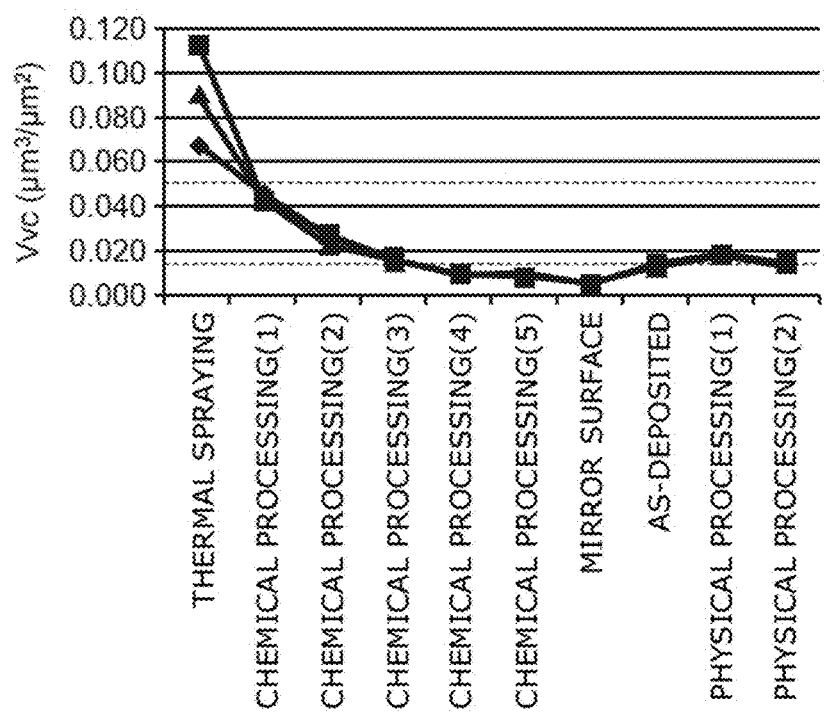

FIG. 25A and FIG. 25B are graphs of the core void volume of the surface of the layer structural component.

The inventor set the cut-off to 0.8 μm and determined the core void volume Vvc of the surface of the layer structural component from the load curve. The results are as shown in FIG. 25A and FIG. 25B.

FIG. 25A is a graph of the core void volume of the first uneven structure 125. FIG. 25B is a graph of the core void volume of the second uneven structure 126. The horizontal axis for the graphs shown in FIG. 25A and FIG. 25B is the different states of the layer structural component formed at the surface of the plasma-resistant member 120. The horizontal axis for the graphs shown in FIG. 25A and FIG. 25B is similar to the horizontal axis of the graph shown in FIG. 8. The vertical axis for the graphs shown in FIG. 25A and FIG. 25B is the core void volume Vvc ($\mu m^3/\mu m^2$) determined from the load curve.

According to FIG. 25B, the core void volume Vvc of the second uneven structure 126 for each of "chemical processing (1)," "chemical processing (2)," "chemical processing (3)," "as-deposited," "physical processing (1)," and "physical processing (2)" is within the range not less than 0.012 $m^3/\mu m^2$ and not more than 0.05 $\mu m^3/\mu m^2$.

Figure 26A:
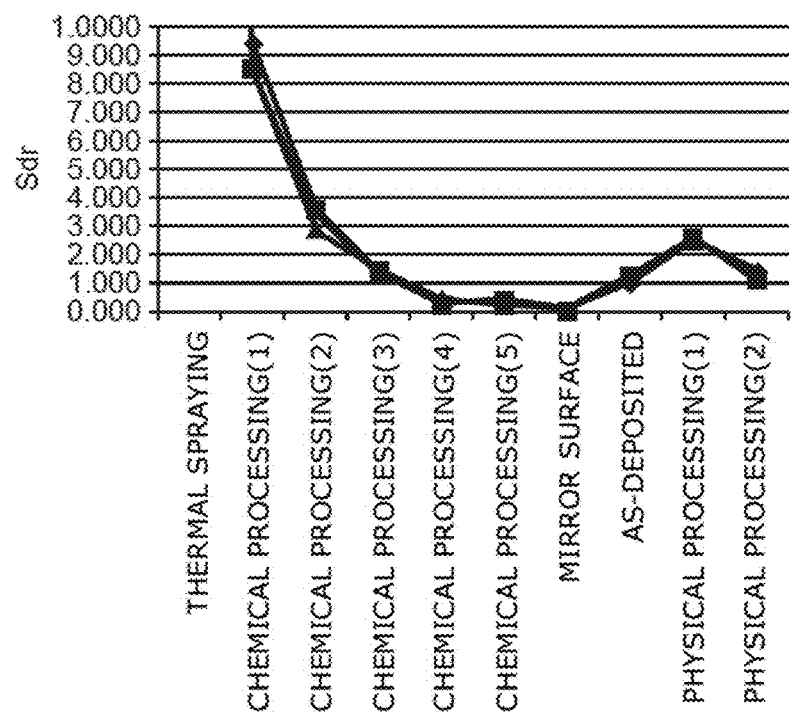
FIG. 26A and FIG. 26B are graphs of the developed interfacial area ratio of the surface of the layer structural component.
Figure 26B:
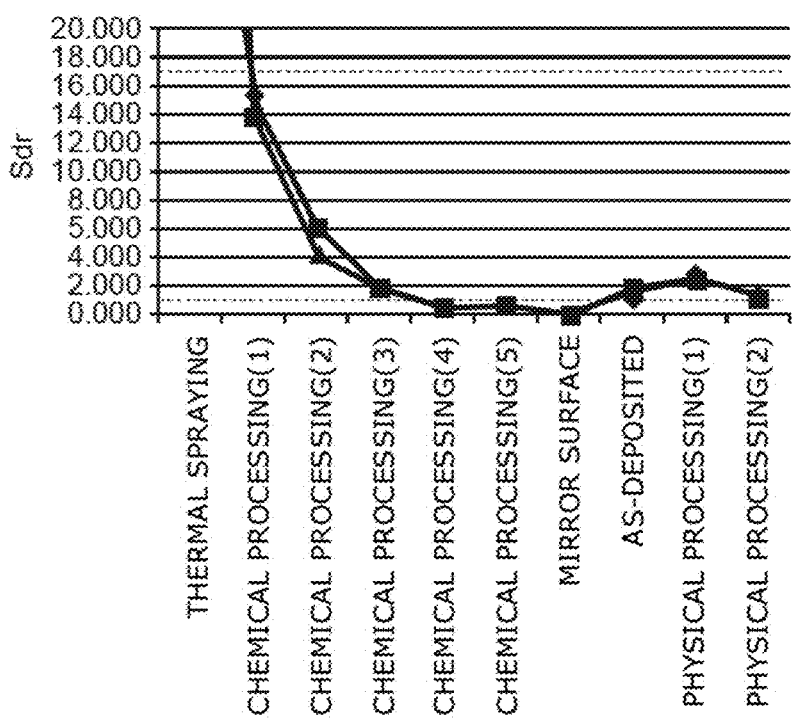

FIG. 26A and FIG. 26B are graphs of the developed interfacial area ratio of the surface of the layer structural component.

The inventor set the cut-off to 0.8 μm and determined the developed interfacial area ratio Sdr of the surface of the layer structural component. The results are as shown in FIG. 26A and FIG. 26B.

FIG. 26A is a graph of the developed interfacial area ratio of the first uneven structure 125. FIG. 26B is a graph of the developed interfacial area ratio of the second uneven structure 126. The horizontal axis for the graphs shown in FIG. 26A and FIG. 26B is the different states of the layer structural component formed at the surface of the plasma-resistant member 120. The horizontal axis for the graphs shown in FIG. 26A and FIG. 26B is similar to the horizontal axis of the graph shown in FIG. 8. The vertical axis for the graphs shown in FIG. 26A and FIG. 26B is the developed interfacial area ratio Sdr.

According to FIG. 26B, the developed interfacial area ratio Sdr of the second uneven structure 126 for each of "chemical processing (1)," "chemical processing (2)," "chemical processing (3)," "as-deposited," "physical processing (1)," and "physical processing (2)" is within the range not less than 1 and not more than 17.

Figure 27A:
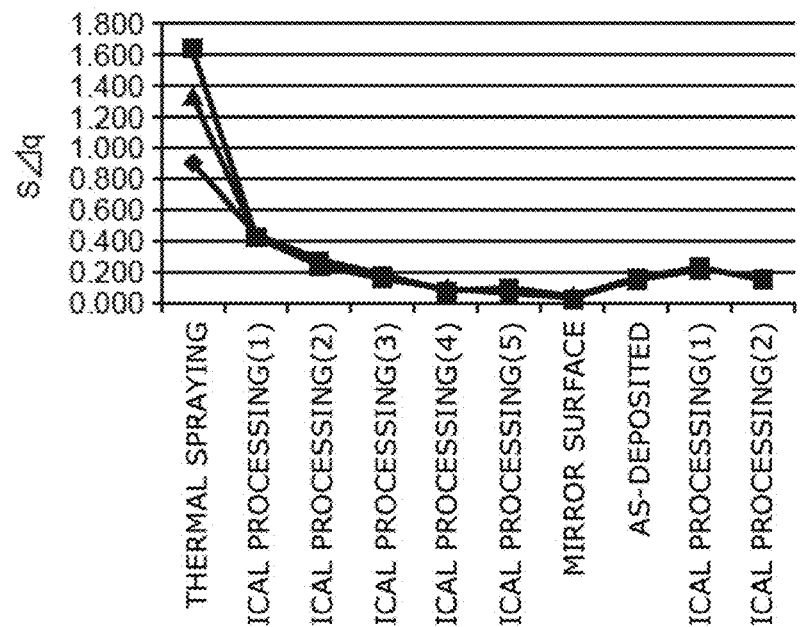
FIG. 27A and FIG. 27B are graphs of the root mean square slope of the surface of the layer structural component.
Figure 27B:
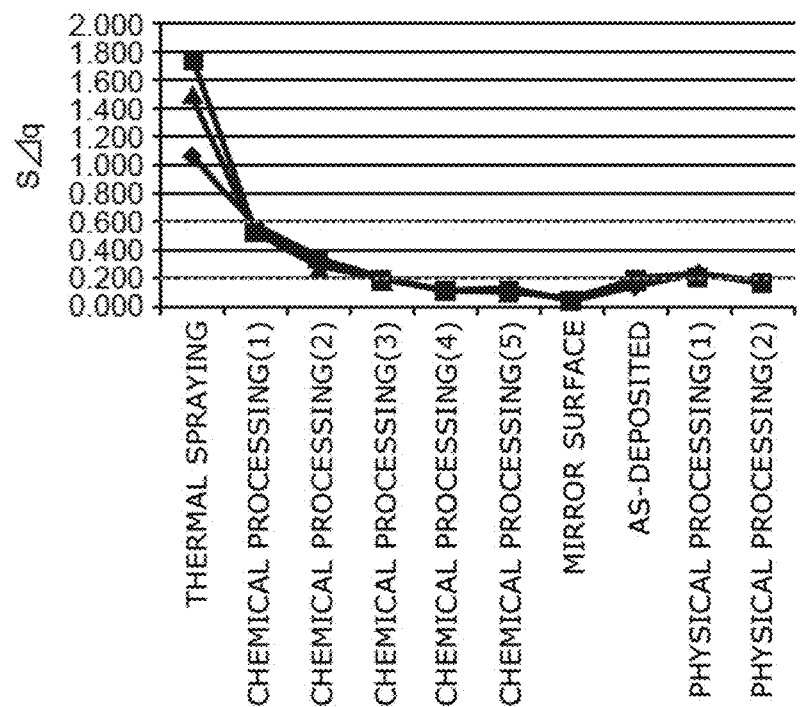

FIG. 27A and FIG. 27B are graphs of the root mean square slope of the surface of the layer structural component.

The inventor set the cut-off to 0.8 μm and determined the root mean square slope SΔq of the surface of the layer structural component. The results are as shown in FIG. 27A and FIG. 27B.

FIG. 27A is a graph of the root mean square slope of the first uneven structure 125.

FIG. 27B is a graph of the root mean square slope of the second uneven structure 126. The horizontal axis for the graphs shown in FIG. 27A and FIG. 27B is the different states of the layer structural component formed at the surface of the plasma-resistant member 120. The horizontal axis for the graphs shown in FIG. 27A and FIG. 27B is similar to the horizontal axis of the graph shown in FIG. 8. The vertical axis for the graphs shown in FIG. 27A and FIG. 27B is the root mean square slope SΔq.

The root mean square slope SΔd is a two-dimensional mean square slope angle Δq for the sampling plane. The surface slope is expressed by the following formula for all sorts of points.

[Formula 4]

$$\rho_{ij} = \left[\left(\frac{\partial Z(x,y)}{\partial x}\right)^2 + \left(\frac{\partial Z(x,y)}{\partial y}\right)^2 + \right]^{1/2}\bigg|_{x=x_i, y=y_j} \quad (4)$$
$$\approx \left[\left(\frac{Z(x_i, y_j) - Z(x_{i-1}, y_j)}{\Delta x}\right)^2 + \left(\frac{Z(x_i, y_j) - Z(x_i, y_{j-1})}{\Delta y}\right)^2\right]^{1/2}$$

Therefore, the root mean square slope SΔq is expressed by the following formula.

[Formula 5]

$$S_{\Delta q} = \sqrt{\frac{1}{(M-1)(N-1)}\sum_{j=2}^{N}\sum_{i=2}^{M}\rho_{ij}^2} \quad (5)$$
$$\approx \sqrt{\frac{1}{(M-1)(N-1)}\sum_{j=2}^{N}\sum_{i=2}^{M}\left[\left(\frac{Z(x_i,y_j)-Z(x_{i-1},y_j)}{\Delta x}\right)^2 + \left(\frac{Z(x_i,y_j)-Z(x_i,y_{j-1})}{\Delta y}\right)^2\right]}$$

According to FIG. 27B, the root mean square slope SΔq of the second uneven structure 126 for each of "chemical processing (1)," "chemical processing (2)," "chemical processing (3)," "as-deposited," "physical processing (1)," and "physical processing (2)" is within the range not less than 0.15 and not more than 0.6.

Figures 28, 29:
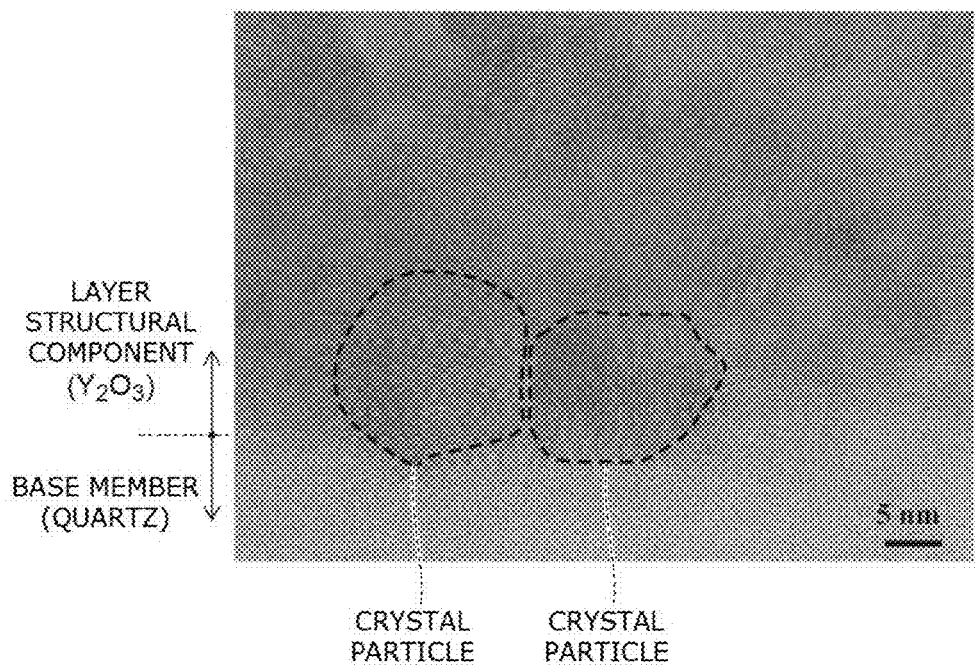
FIG. 28 is a table showing an example of the measurement result of the adhesion strength of the pre-coated film.
FIG. 29 is a photograph in which the interior of the layer structural component of the embodiment is imaged.

FIG. 28 is a table showing an example of the measurement result of the adhesion strength of the pre-coated film.

The inventor set the cut-off to 0.8 μm and calculated the peeling area ratio (%) of the covering film (in this specific example, a film of $SiO_2$) by the measurement method described above in regard to FIG. 17 to FIG. 20B. The evaluation of the peeling area ratio of the covering film and the adhesion strength of the covering film is as shown in FIG. 28. The determination standard of the evaluation of the adhesion strength of the covering film is as described above in regard to FIG. 21A and FIG. 21B.

According to FIG. 28, the peeling area ratio of the covering film for each of "chemical processing (1)," "chemical processing (2)," "as-deposited," and "physical processing (2)" is within the range not less than 0% but less than 20%.

"Thermal spraying" was unmeasurable due to the reasons described above in regard to FIG. 21A and FIG. 21B.

The aerosol deposition will now be described further.

FIG. 29 is a photograph in which the interior of the layer structural component of the embodiment is imaged.

Figures 30, 31:
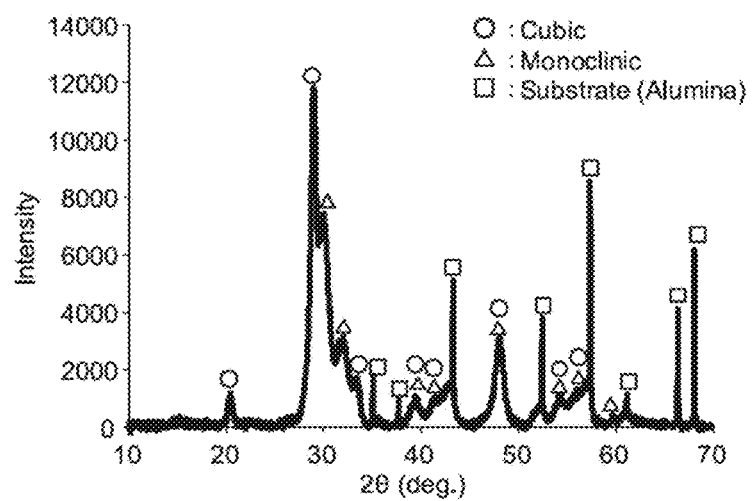
FIG. 30 is a table comparing the average crystal particle sizes for different methods for forming the layer structural component.
FIG. 31 is a graph of an example of the results of XRD measurements of the layer structural component formed by aerosol deposition.

FIG. 30 is a table comparing the average crystal particle sizes for different methods for forming the layer structural component.

As described above in regard to FIG. 1, the layer structural component 123 is formed by aerosol deposition. According to aerosol deposition, a heating unit or the like is not particularly necessary; and it is possible to form the layer structural component 123 at room temperature. Therefore, a grain boundary layer does not exist at the interface between the layer structural component 123 (123a) and the base member 121 or in the interior of the layer structural component 123 (123a).

FIG. 29 is a photograph imaged by TEM. In the photograph shown in FIG. 29, the layer structural component 123 of the yttria polycrystalline body is formed by aerosol deposition on the surface of the base member 121 of quartz. According to the photograph shown in FIG. 29, a grain boundary layer does not exist at the interface between the layer structural component 123 (123a) and the base member 121 or in the interior of the layer structural component 123 (123a). An amorphous phase or an unusual phase was not induced.

Thereby, the existence or absence of the grain boundary layer can be one determination criteria of whether or not the layer structural component 123 is formed by aerosol deposition.

In aerosol deposition (AD), the fine particles are deformed or fragmented without a heating process. Therefore, in the case where crystalline brittle material fine particles are used as the source material for the hybrid structural component formed by aerosol deposition, the crystal particle size of the portion of the layer structural component 123 of the hybrid structural component is small compared to the source material fine particle size, the crystal particle size of a sintered body, and the crystal particle size of a thermal-sprayed film.

As in the photograph shown in FIG. 29, the crystal particle size of the yttria polycrystalline body was about 15 to 20 nm. As in the comparison table shown in FIG. 30, the average crystal particle size of the yttria polycrystalline body formed by aerosol deposition (AD) was 19 nm as calculated by XRD (X-ray Diffraction) analysis.

On the other hand, the average crystal particle size of the yttria sintered body was 218 nm. The average crystal particle size of the yttria thermal-sprayed film was 71 nm. That is, the average crystal particle size of the yttria polycrystalline body formed by aerosol deposition is about 15 to 20 nm and is smaller than the average crystal particle size of the yttria sintered body and the average crystal particle size of the yttria thermal-sprayed film.

Thereby, the average crystal particle size can be one determination criteria of whether or not the layer structural component 123 is formed by aerosol deposition.

In the embodiment, the diameter of the average crystal particle is normally not less than 5 nanometers (nm) and not more than 50 nanometers (nm). It is more favorable for the diameter of the average crystal particle to be 30 nanometers (nm) or less.

FIG. 31 is a graph of an example of the results of XRD measurements of the layer structural component formed by aerosol deposition.

In the case where crystalline brittle material fine particles are used as the source material for the hybrid structural component formed by aerosol deposition, the crystal has no orientation. Conversely, in the case where crystalline brittle material fine particles are used as the source material for the hybrid structural component formed by CVD (Chemical Vapor Deposition), etc., the crystal has an orientation.

As in the graph shown in FIG. 31, the crystal structure of the layer structural component 123 formed by aerosol deposition has a mixed crystal structure including a cubic crystal and a monoclinic crystal. The crystal of the layer structural component 123 formed by aerosol deposition does not have an orientation.

Thereby, the existence or absence of the orientation of the crystal can be one determination criteria of whether or not the layer structural component 123 is formed by aerosol deposition.

Figure 32:
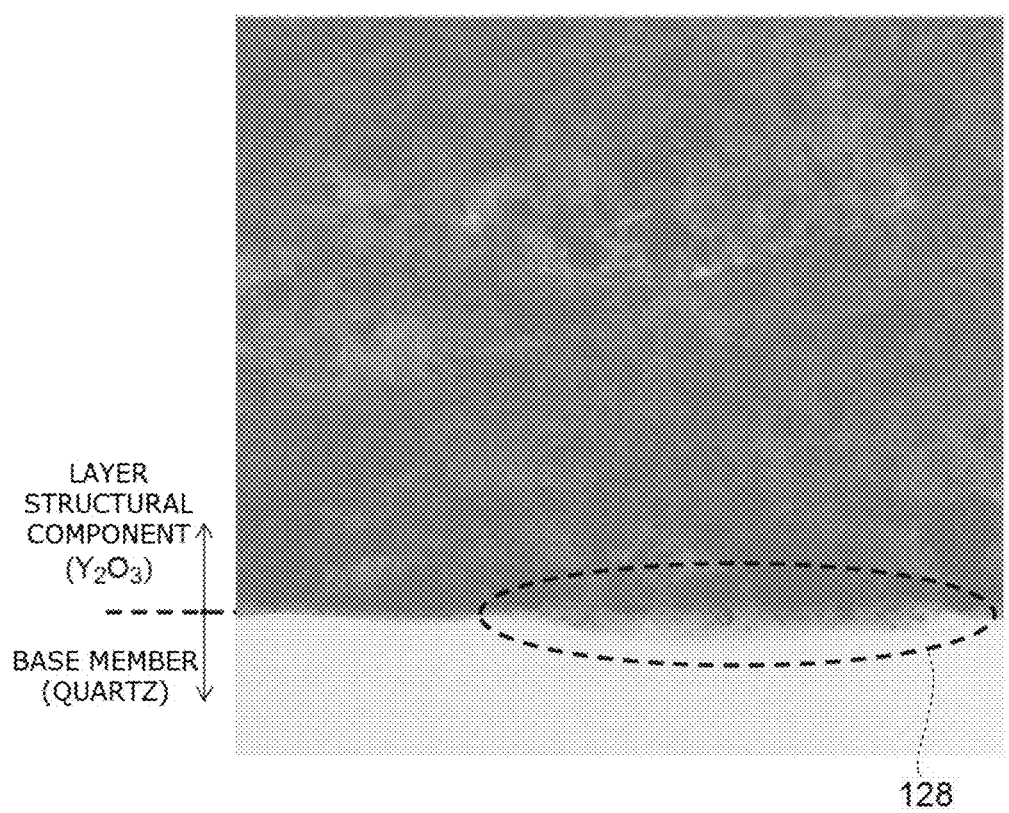
FIG. 32 is a photograph in which another part of the interior of the layer structural component of the embodiment is imaged.

FIG. 32 is a photograph in which another part of the interior of the layer structural component of the embodiment is imaged.

FIG. 32 is a photograph imaged by TEM. In the photograph shown in FIG. 32, the layer structural component 123 of the yttria polycrystalline body is formed by aerosol deposition on the surface of the base member 121 of quartz. An anchor layer 128 that juts into the surface of the base member 121 is formed at the portion of the layer structural component 123. The layer structural component 123 in which the anchor layer 128 is formed is securely adhered to the base member 121 with exceedingly high strength.

Hereinabove, embodiments of the invention are described. However, the invention is not limited to these descriptions. Appropriate design modifications to the embodiments described above made by one skilled in the art also are within the scope of the invention to the extent that the features of the invention are included. For example, the configurations, dimensions, materials, arrangements, etc., of the components included in the semiconductor manufacturing apparatus 100, etc., the mounting forms of the plasma-resistant member 120 and the electrostatic chuck 160, etc., are not limited to the illustrations and can be modified appropriately.

The components included in the embodiments described above can be combined to the extent of technical feasibility; and such combinations are within the scope of the invention to the extent that the features of the invention are included.

INDUSTRIAL APPLICABILITY

According to an aspect of the invention, a plasma-resistant member is provided that can reduce particles or increase the adhesion strength or adhesion force of a covering film that covers the interior wall of a chamber.

REFERENCE SIGNS LIST 100 semiconductor manufacturing apparatus
110 chamber
120 plasma-resistant member
121 base member
123, 123a, 123b, 123c layer structural component
125 first uneven structure
126 second uneven structure
128 anchor layer
141 scratch mark
143 peeling regions
145 OHP sheet
160 electrostatic chuck
191 region
193 protrusions (or holes)
210 wafer
221 particles
251 indenter

The invention claimed is:

1. A plasma-resistant member, comprising:
a base member; and
a layer structural component formed at a surface of the base member, the layer structural component including an yttria polycrystalline body and being plasma resistant, the layer structural component is formed by aerosol deposition,
the layer structural component being a polycrystalline body having a crystal particle size smaller than a particle size of source material used in forming the polycrystalline body,
the layer structural component including
a first uneven structure having voids made in a portion of a surface of the layer structural component, the voids being where groups of crystal particles detached, and
a second uneven structure formed to be superimposed onto the first uneven structure in the entire surface of the layer structural component, the second uneven structure having an unevenness finer than an unevenness of the first uneven structure, the unevenness of the second uneven structure having the crystal particle size, wherein
an arithmetic average Sa of a surface of the layer structural component is not less than 0.025 µm and not more than 0.075 µm,
a core material volume Vmc determined from a load curve of the surface of the layer structural component is not less than 0.03 µm$^3$/µm$^2$ and not more than 0.08 µm$^3$/µm$^2$,
a core void volume Vvc determined from the load curve of the surface of the layer structural component is not less than 0.03 µm$^3$/µm$^2$ and not more than 0.1 µm$^3$/µm$^2$, and
a developed interfacial area ratio Sdr of the surface of the layer structural component is not less than 3 and not more than 28.

2. The plasma-resistant member according to claim 1, wherein the first uneven structure and the second uneven structure are formed by performing chemical processing.

3. The plasma-resistant member according to claim 1, wherein an interior of the layer structural component has a sparse and dense structure of the yttria polycrystalline body, wherein the sparse and dense structure includes sparse portions distributed three-dimensionally inside a dense portion, and a density of the sparse portions is lower than a density of the dense portion.

4. The plasma-resistant member according to claim 3, wherein the sparse portions of the sparse and dense structure become smaller from a layer at a surface of the layer structural component toward a layer deeper than the layer at the surface.

* * * * *